US012015080B2

(12) United States Patent
Nakamura et al.

(10) Patent No.: US 12,015,080 B2
(45) Date of Patent: Jun. 18, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: Yoshitaka Nakamura, Boise, ID (US); Yi Fang Lee, Boise, ID (US); Jerome A. Imonigie, Boise, ID (US); Scott E. Sills, Boise, ID (US); Aaron Michael Lowe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 16/998,877

(22) Filed: Aug. 20, 2020

(65) Prior Publication Data

US 2022/0059693 A1 Feb. 24, 2022

(51) Int. Cl.
*H01L 29/78* (2006.01)
*H01L 29/08* (2006.01)
*H01L 29/10* (2006.01)
*H01L 29/24* (2006.01)
*H01L 29/417* (2006.01)
(Continued)

(52) U.S. Cl.
CPC ...... *H01L 29/7827* (2013.01); *H01L 29/0847* (2013.01); *H01L 29/1037* (2013.01); *H01L 29/24* (2013.01); *H01L 29/41741* (2013.01); *H01L 29/45* (2013.01); *H10B 12/05* (2023.02); *H10B 12/31* (2023.02)

(58) Field of Classification Search
CPC . H01L 29/0847; H01L 29/1037; H01L 29/24; H01L 29/41741; H01L 29/45; H01L 29/7827; H01L 29/78642; H10B 12/05; H10B 12/30; H10B 12/31; H10B 12/315; H10B 12/48
See application file for complete search history.

(56) References Cited

U.S. PATENT DOCUMENTS 7,635,889 B2    12/2009    Isa et al.
10,340,374 B2    7/2019    Dewey et al.
(Continued)

FOREIGN PATENT DOCUMENTS

TW      201019516      5/2010
TW      201027818      7/2010
(Continued)

*Primary Examiner* — Nicholas J Tobergte
*Assistant Examiner* — Kevin Quinto
(74) *Attorney, Agent, or Firm* — Wells St. John P.S.

(57) ABSTRACT

Some embodiments include an integrated assembly having an access device between a storage element and a conductive structure. The access device has channel material which includes semiconductor material. The channel material has a first end and an opposing second end, and has a side extending from the first end to the second end. The first end is adjacent the conductive structure, and the second end is adjacent the storage element. Conductive gate material is adjacent the side of the channel material. A first domed metal-containing cap is over the conductive structure and under the channel material and/or a second domed metal-containing cap is over the channel material and under the storage element. Some embodiments include methods of forming integrated assemblies.

15 Claims, 28 Drawing Sheets

(51) Int. Cl.
  *H01L 29/45* (2006.01)
  *H10B 12/00* (2023.01)

(56) References Cited

U.S. PATENT DOCUMENTS

| | | | |
|---|---|---|---|
| 10,411,007 B2 | 9/2019 | Dewey et al. | |
| 10,658,471 B2 | 5/2020 | Dasgupta et al. | |
| 2008/0142821 A1* | 6/2008 | Sakamoto | H01L 33/382 |
| | | | 257/E33.068 |
| 2009/0117327 A1* | 5/2009 | Takada | H01B 1/04 |
| | | | 428/141 |
| 2015/0076495 A1* | 3/2015 | Miyairi | H01L 29/78642 |
| | | | 257/43 |
| 2015/0171084 A1* | 6/2015 | Lin | H01L 21/32135 |
| | | | 257/369 |
| 2021/0265267 A1* | 8/2021 | Wu | H01L 23/485 |

FOREIGN PATENT DOCUMENTS

| | | |
|---|---|---|
| TW | 201029188 | 8/2010 |
| TW | 201101466 | 1/2011 |
| TW | 201721759 | 6/2017 |
| TW | 201721871 | 6/2017 |
| TW | 201739006 | 11/2017 |
| TW | 201913329 | 4/2019 |

* cited by examiner

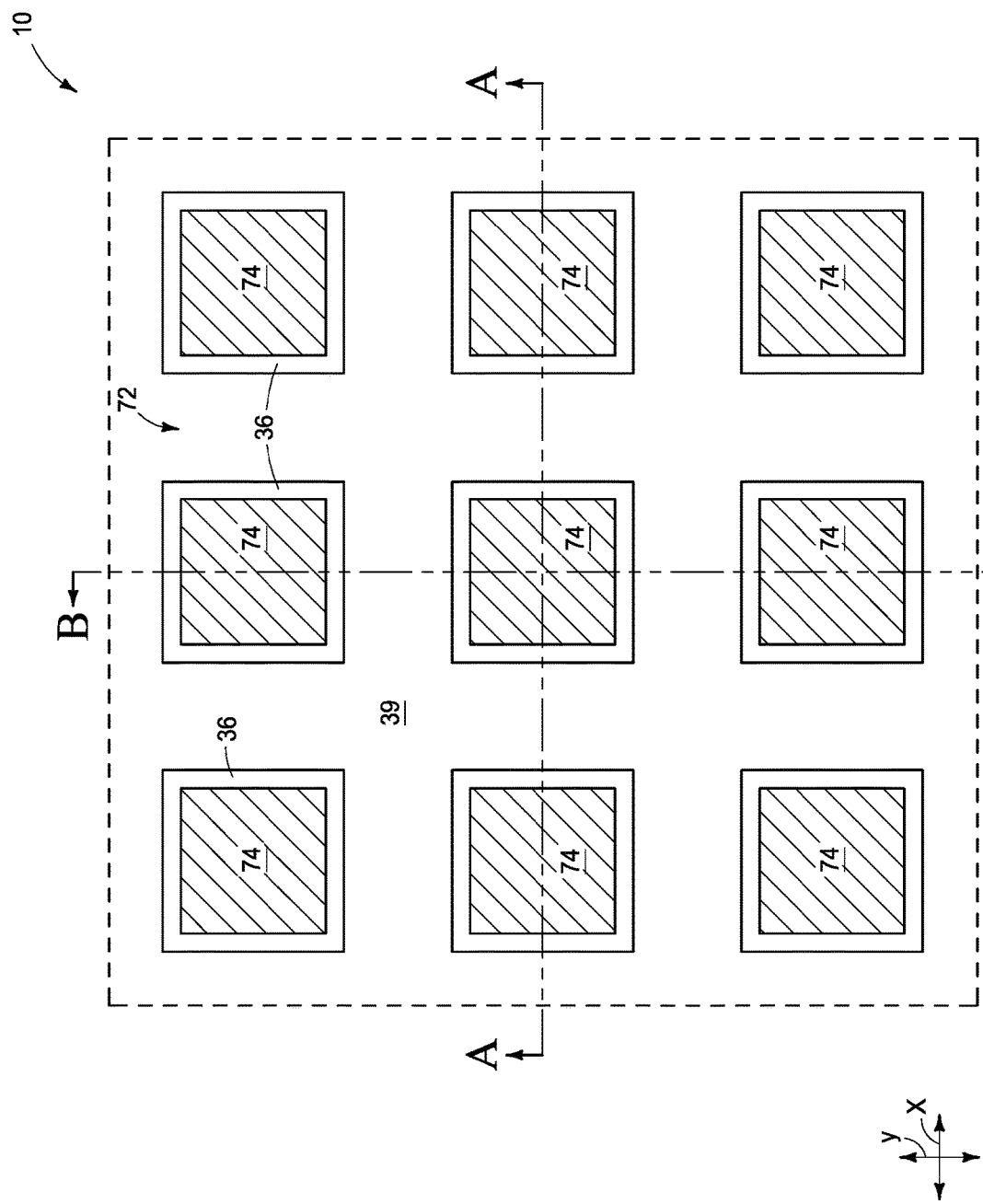

INTEGRATED ASSEMBLIES AND METHODS OF FORMING INTEGRATED ASSEMBLIES

TECHNICAL FIELD

Integrated assemblies (e.g., integrated memory). Methods of forming integrated assemblies.

BACKGROUND

Memory may utilize memory cells which individually comprise an access device (e.g., an access transistor) in combination with a storage element (e.g., a capacitor, a resistive memory device, a phase change memory device, etc.).

It would be desirable to develop improved transistors and improved memory architecture.

BRIEF DESCRIPTION OF THE DRAWINGS

FIG. 1B is a cross-sectional side view along the line B-B of FIG. 1.

FIGS. 2-2B are diagrammatic views of a region comprising example transistors. FIG. 2B is a cross-sectional side view along the line B-B of FIG. 2. FIG. 2 is a top-down sectional view along the line C-C of FIGS. 2A and 2B.

FIG. 3B is a cross-sectional side view along the line B-B of FIG. 3. FIG. 3 is a top-down sectional view along the line C-C of FIGS. 3A and 3B.

FIG. 4B is a cross-sectional side view along the line of FIG. 4. FIG. 4 is a top-down sectional view along the line C-C of FIGS. 4A and 4B.

FIG. 5B is a cross-sectional side view along the line of FIG. 5. FIG. 5 is a top-down view.

FIG. 6B is a cross-sectional side view along the line B-B of FIG. 6. FIG. 6 is a top-down view.

FIG. 7B is a cross-sectional side view along the line B-B of FIG. 7. FIG. 7 is a top-down view.

FIGS. 8-8B are diagrammatic views of the region of FIGS. 5-5B at an example process stage subsequent to that of FIGS. 7-7B. FIG. 8B is a cross-sectional side view along the line B-B of FIG. 8. FIG. 8 is a top-down view.

FIG. 9B is a cross-sectional side view along the line B-B of FIG. 9. FIG. 9 is a top-down view.

DETAILED DESCRIPTION OF THE ILLUSTRATED EMBODIMENTS

Some embodiments include a transistor which has channel material comprising semiconductor material (e.g., semiconductor oxide), and which has a first domed metal-containing cap under the channel material and/or a second domed metal-containing cap over the channel material. The transistor may be utilized as an access device of a memory cell. Some embodiments include methods of forming integrated assemblies. Example embodiments are described with reference to FIGS. 1-10.

Figure 1:
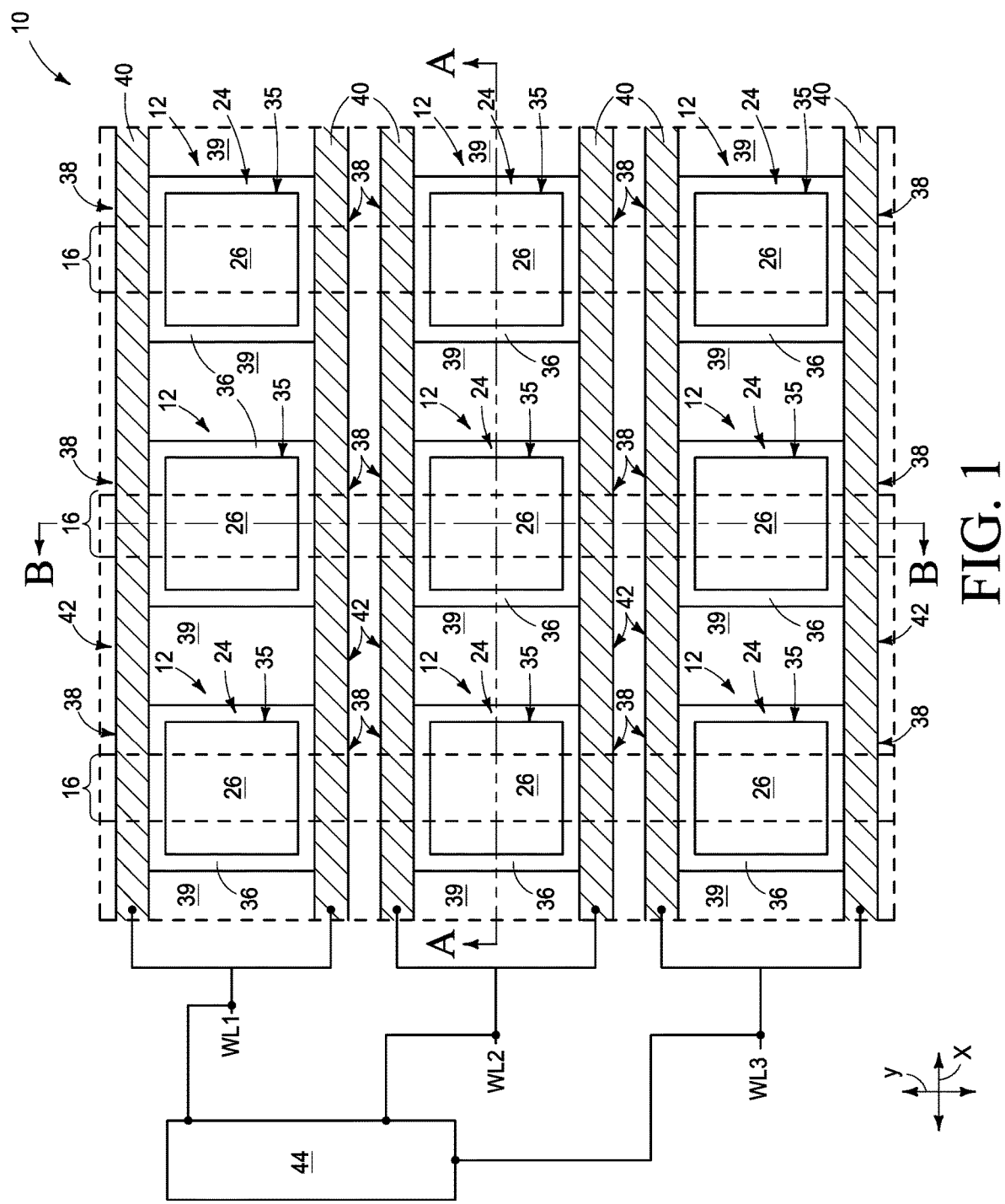
FIGS. 1-1B are diagrammatic views of a region comprising example transistors.
Figure 1A:
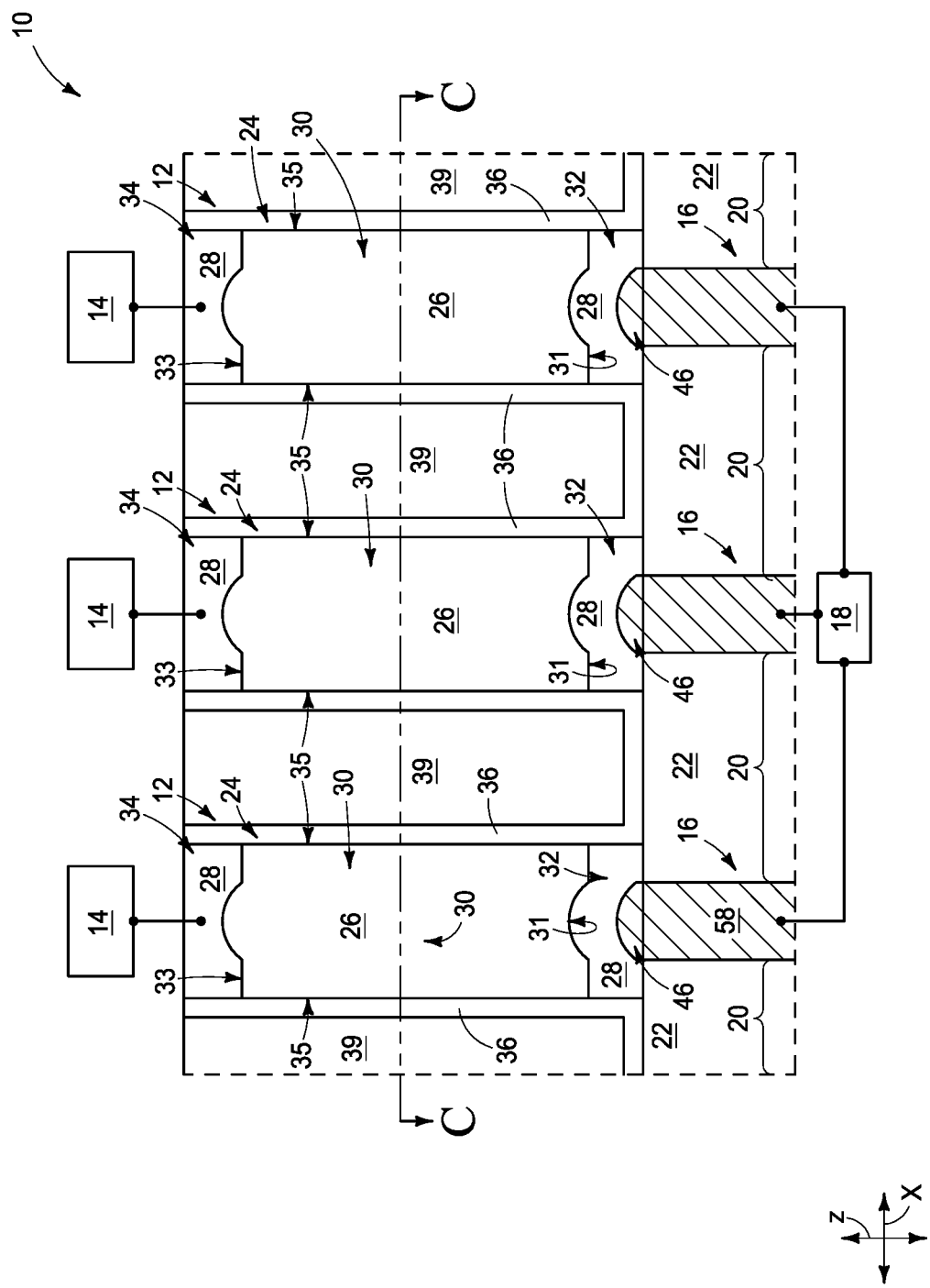
FIG. 1A is a cross-sectional side view along the line A-A of FIG. 1
Figure 1B:
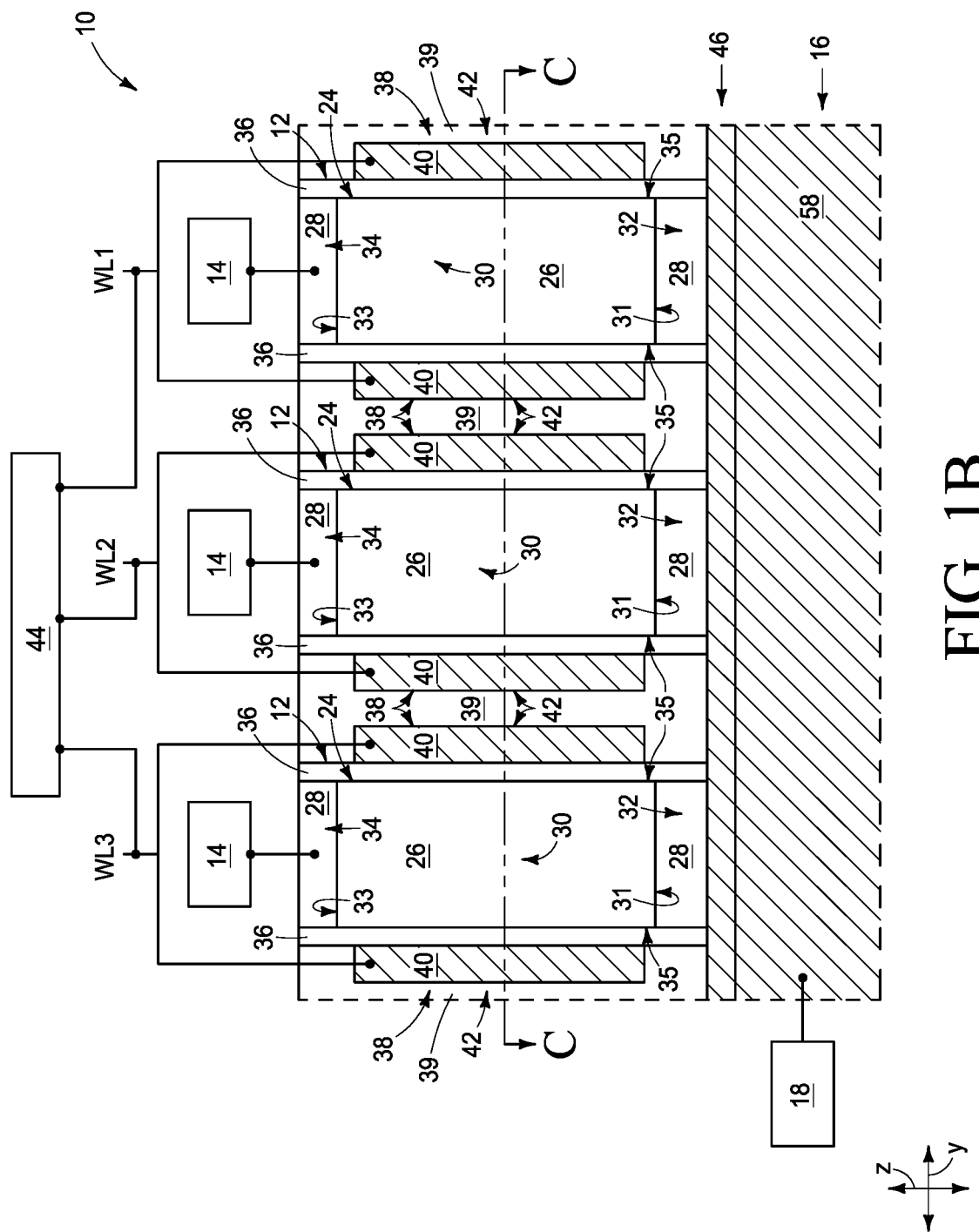

Referring to FIGS. 1-1B, an integrated assembly 10 includes access devices 12 coupled between storage elements 14 and conductive structures 16.

The storage elements 14 may be any suitable devices having at least two detectable states; and in some embodiments may be, for example, capacitors, resistive-memory devices, conductive-bridging devices, phase-change-memory (PCM) devices, programmable metallization cells (PMCs), etc.

The conductive structures 16 may be linearly-extending structures (as shown), and may, for example, correspond to digit lines (bitlines, sense lines, etc.). The linearly-extending structures 16 extend along a first direction, with such a first direction being indicated to be a y-axis direction along the views of FIGS. 1-1B. Although the linearly-extending structures 16 are shown to be straight, in other embodiments they may be curved, wavy, etc. The structures 16 are shown in dashed-line (phantom) view in FIG. 1 to indicate that they are under other structures and materials. The conductive structures 16 comprise conductive material 58. The conductive material 58 may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive structures 16 may comprise, consist essentially of, or consist of tungsten and/or molybdenum.

The conductive structures 16 may be coupled with sensing circuitry (e.g., sense-amplifier-circuitry) 18, as shown in FIGS. 1A and 1B.

The conductive structures 16 may be supported by a semiconductor base (described below with reference to FIGS. 5-5B).

The conductive structures 16 are spaced from one another by intervening regions 20 comprising insulative material 22. The insulative material 22 may comprise any suitable composition(s), such as, for example, silicon dioxide.

Each of the access devices 12 includes a pillar 24 comprising semiconductor material 26 and conductive oxide material 28. The pillars 24 extend vertically in the configuration of FIGS. 1-1B (i.e., extend along an illustrated z-axis). In some embodiments, the pillars 24 may be referred to as vertically-extending pillars. The pillars 24 may be substantially vertical, with the term "substantially vertical" means vertical to within reasonable tolerances of fabrication and measurement. In some embodiments, the vertically-extending pillars may extend orthogonally relative to the illustrated x-axis. In some embodiments, the vertically-extending pillars may be about orthogonal to the illustrated x-axis, with the term "about orthogonal" meaning orthogonal to within about ±15°.

The semiconductor material 26 of the pillars 24 may be considered to correspond to channel regions 30, and the conductive oxide material 28 of the pillars may be considered to correspond to first and second source/drain regions 32 and 34. Each of the illustrated channel regions 30 has a lower end (first end) 31 and an upper end (second end) 33, with the upper end being in opposing relation to the lower end. The first source/drain region 32 is directly against the lower end 31, and the second source/drain region 34 is directly against the upper end 33. In some embodiments, the lower ends 31 of the channel regions 30 may be considered to be adjacent the conductive structures 16, and the upper ends 33 of the channel regions 30 may be considered to be adjacent the storage elements 14. In some embodiments, the lower source/drain regions 32 may be considered to be first conductive regions between the conductive structures 16 and the channel regions 30, and the upper source/drain regions 34 may be considered to be second conductive regions between the channel regions 30 and the storage elements 14.

The illustrated boundaries between the semiconductor material 26 and the conductive oxide material 28 within the pillars 24 may be abrupt interfaces, gradients, or any other suitable boundaries.

In some embodiments, the semiconductor material 26 may be referred to as channel material within the access devices 12. Such channel material has sides (sidewalk) 35 extending from the first ends 31 to the second ends 33.

The semiconductor material 26 may comprise any suitable composition(s); and in some embodiments may comprise, consist essentially of, or consist of at least one metal e.g., one or more of aluminum, gallium, indium, thallium, tin, cadmium, zinc, etc.) in combination with one or more of oxygen, sulfur, selenium and tellurium in some embodiments, the semiconductor material 26 may comprise at least one element from Group 13 of the periodic table (e.g., gallium) in combination with at least one element from Group 16 of the periodic table (e.g., oxygen). For instance, the semiconductor material 26 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 26 may comprise, consist essentially of, or consist of a semiconductor oxide (i.e., a semiconductor material comprising oxygen). For instance, in some embodiments the semiconductor material 26 may comprise, consist essentially of, or consist of InGaZnO (where the chemical formula indicates primary constituents rather than a specific stoichiometry).

The conductive oxide material 28 may comprise any suitable composition(s), and in some embodiments may comprise, consist essentially of, or consist of oxygen in combination with one or more of indium, zinc and tin. In some embodiments, the conductive oxide material 28 may comprise oxygen in combination with zinc, and may further comprise one or both of aluminum and gallium. The aluminum and gallium may be present as dopants within zinc oxide.

The access devices 12 include insulative material 36 along the sidewalls 35 of the channel material 26. In the shown embodiment, the insulative material 36 extends along the full vertical dimension of the pillars 24. In other embodiments, the insulative material 36 may extend along only portions of the vertical dimensions of the pillars 24. The insulative material 36 may be referred to as gate dielectric material. The insulative material 36 may comprise any suitable composition(s), and in some embodiments may comprise silicon dioxide and/or one or more high-k compositions (with the term "high-k" meaning a dielectric constant greater than that of silicon dioxide). Example high-k compositions (materials) include aluminum oxide, zirconium oxide, hafnium oxide, etc.

Conductive gates 38 are adjacent the sides 35 of the channel material 26. The conductive gates 38 comprise conductive gate material 40. The conductive gate material may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive gate material 40 is configured as linear structures 42. The linear structures 42 extend along a second direction (the illustrated x-axis direction) which crosses the first direction (the illustrated y-axis direction) The second direction of the second linear structures 42 may be orthogonal to (or at least substantially orthogonal to) the first direction of the first linear structures 16 (as shown). Although the second linear structures 42 are shown to be straight, in other embodiments the second linear structures 42 may be curved, wavy, etc.

The second linear structures may correspond to wordlines WL1, WL2 and WL3 (as shown). Such wordlines may be coupled with driver circuitry 44 (e.g., wordline-driver-circuitry).

Insulative material 39 is over the linear conductive structures 42 (wordlines), and between the access devices 12. The insulative material 39 may comprise any suitable composition(s), and in some embodiments may comprise, consist essentially of, or consist of one or more of silicon dioxide, silicon nitride, etc.

In some embodiments, the access devices 12 may correspond to access transistors. Operation of such transistors comprises gatedly coupling the source/drain regions 32 and 34 to one another through the channel regions 30. When the term "gated coupling" is utilized herein, such may refer to the controlled coupling/decoupling of the source/drain regions 32 and 34 that may be induced by electrical activation/deactivation of the wordlines WL1-WL3. In some operational modes of the transistors, electrical flow through the channel regions 30 is induced by electric fields provided by the gates 38, and accordingly the conductive structures 16 are electrically coupled through the channel material (semiconductor material) 26 to the storage elements 14. In other operational modes, the electric fields are not generated, and accordingly the conductive structures 16 are decoupled from the storage elements 14. In some embodiments, each of the access transistors 12 may be considered to have at least one operational mode in which the semiconductor material 26 is electrically coupled with one of the conductive structures 16 and one of the storage elements 14.

The illustrated access devices (access transistors) 12 include metal-containing caps 46 over the conductive structures 16. The metal-containing caps are domed in the illustrated embodiment (i.e., comprise central regions which are higher than edge regions) The metal-containing caps may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the metal-containing caps may comprise, consist essentially of, or consist of one or more of Cu, Ru, Pt, Pd, Co, Ni, W, Mo and Ti. In some embodiments, the metal-containing caps may include one or both of metal silicide (e.g., titanium silicide, tungsten silicide, molybdenum silicide, etc.) and metal nitride (e.g., titanium nitride, tungsten nitride, molybdenum nitride, etc.)

An advantage of the metal-containing caps 46 may be that such may alleviate oxidation of conductive material of the structures 16 that may otherwise be induced by the conductive oxide 28. For instance, in some embodiments the conductive structures 16 comprise tungsten, molybdenum (or other oxidizable material). In such embodiments it may be problematic for the conductive oxide 28 to directly contact the oxidizable conductive material of the conductive structures 16 as such may induce oxidation of upper surfaces of the oxidizable material of the conductive structures, which may problematically lead to increased resistance along an interface where the conductive oxide 28 joins with the conductive material of the conductive structures 16. The conductive caps 46 may preclude such problematic oxidation of the upper surfaces of the conductive structures 16.

The domed shape of the conductive caps 46 may be advantageous in that such may reduce contact resistance along the interface of the conductive caps 46 and the conductive oxide 28 by providing additional surface area (as compared to conductive caps which are not domed). Additionally, or alternatively, the domed shape may reduce interfacial strain between the conductive caps 46 and the conductive oxide 28, which may enhance mechanical robustness.

The domed shape of the conductive caps 46 may or may not propagate through materials of the pillars 24 depending on the methods of fabrication of such pillars. In the shown embodiment the domed shape of the conductive caps propagates through some of the materials of the pillars 24 (specifically, the lower conductive oxide material 28 and the channel material 26).

The pillars 24 may be arranged in an array, with rows of the array extending along the illustrated x-axis direction and columns of the array extending along the illustrated y-axis direction. Accordingly, the wordlines WL1-WL3 may be considered to extend along rows of the array, and the digit lines 16 may be considered to extend along columns of the array. Each of the access devices 12 may be considered to be uniquely addressed by one of the wordlines and one of the digit lines. The access devices 12 and the storage elements 14 may be considered to correspond to memory cells of the array. The array may comprise hundreds, thousands, millions, etc., of such memory cells, with the memory cells being substantially identical to one another (where the term "substantially identical" means identical to within reasonable tolerances of fabrication and measurement).

Figure 2:
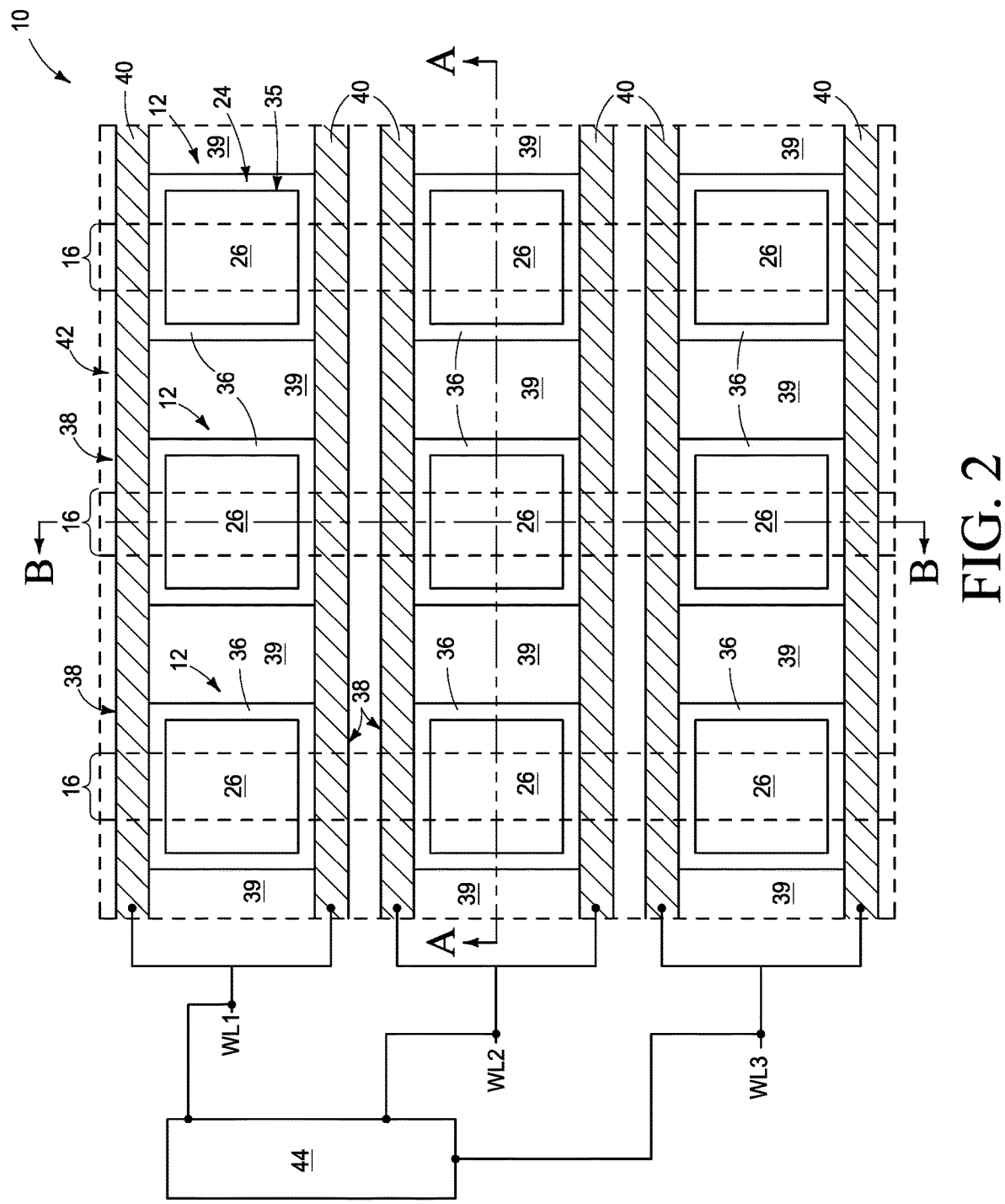
FIG. 2 is a top-down sectional view along the line C-C of FIGS. 1A and 1B.
Figure 2A:
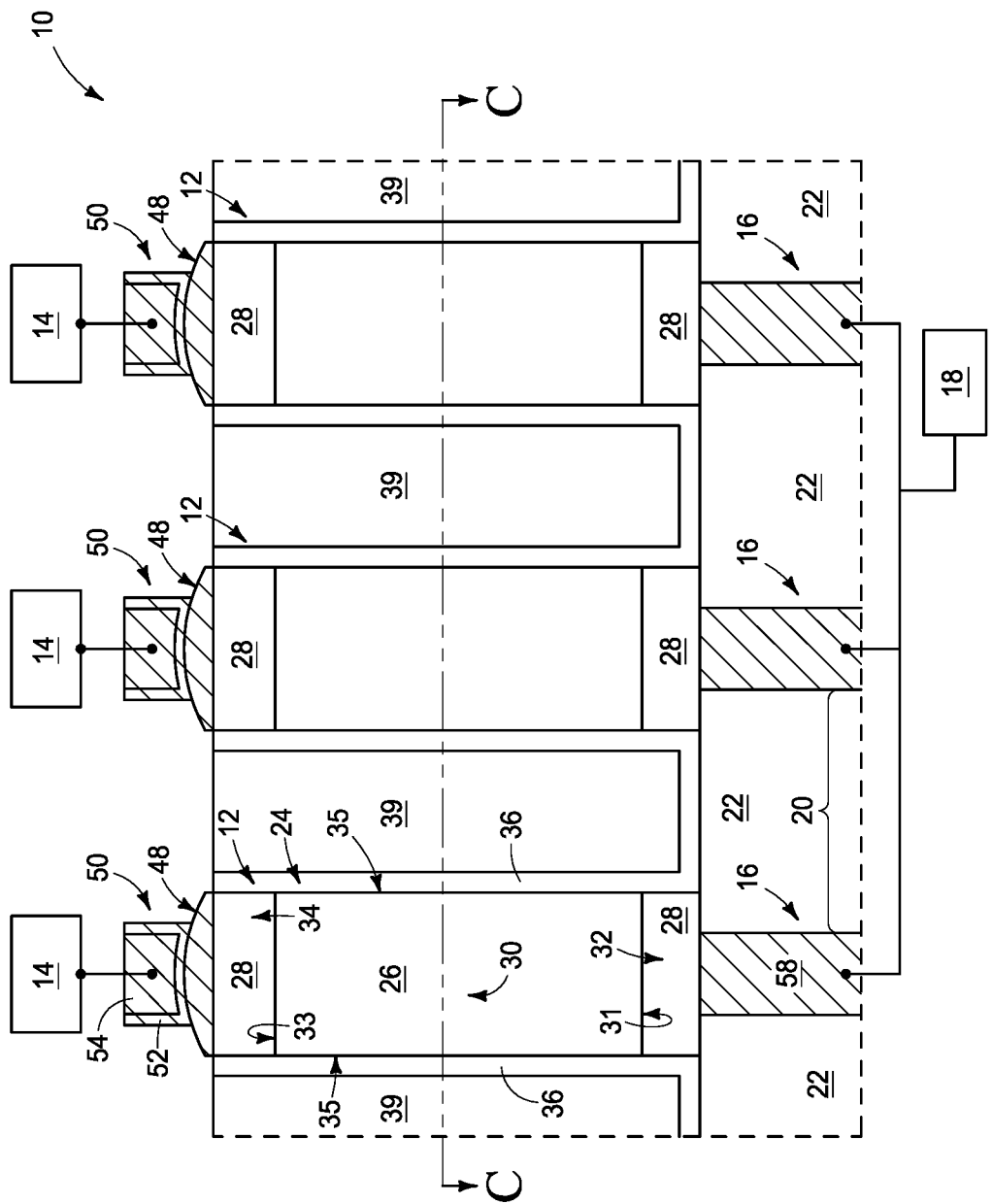
FIG. 2A is a cross-sectional side view along the line A-A of FIG. 2
Figure 2B:
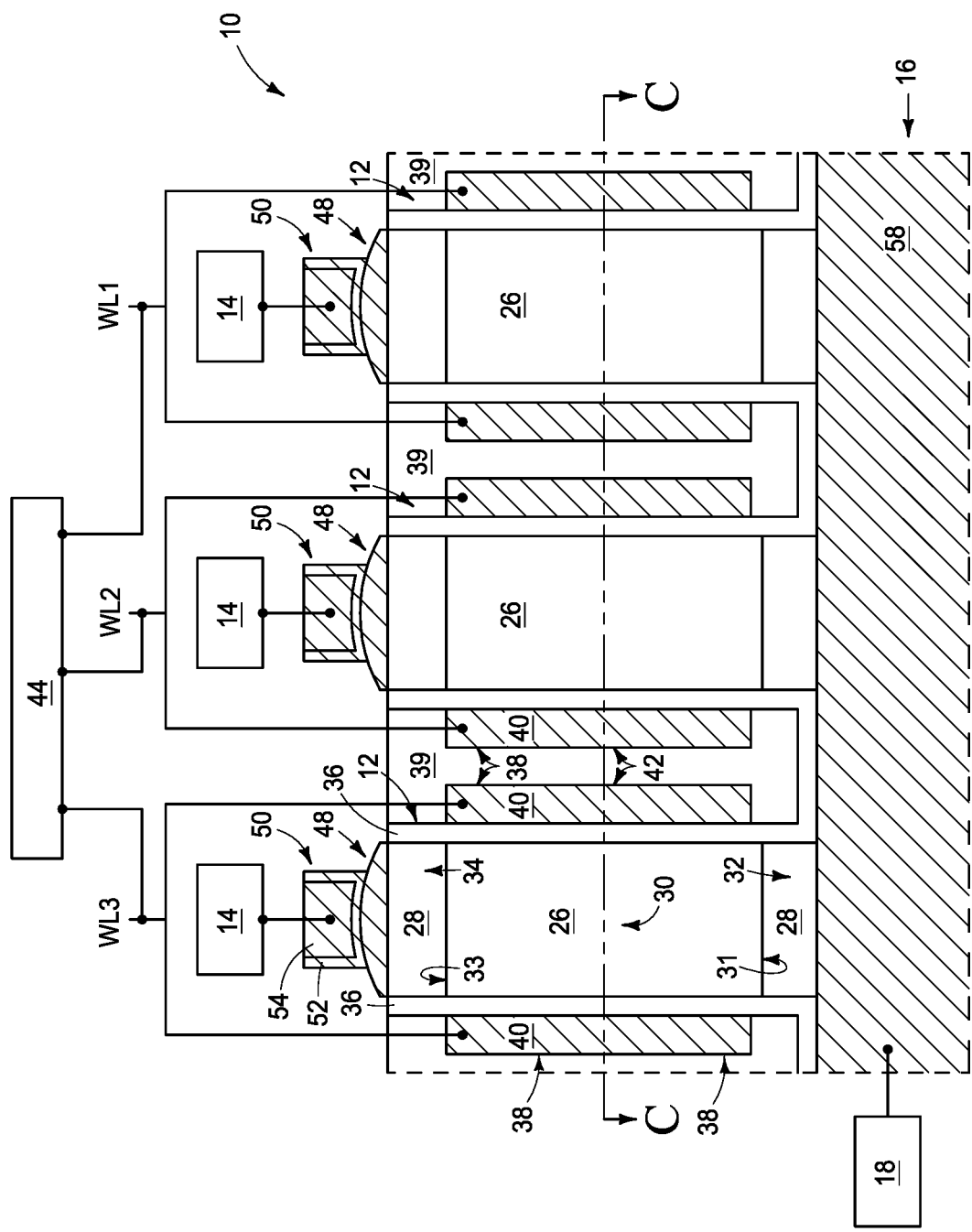

FIGS. 2-2B illustrate another embodiment of the assembly 10. The assembly of FIGS. 2-2B lacks the conductive caps 46 (FIGS. 1-1B), and instead has metal-containing caps 48 over and directly against the upper source/drain regions 34 of the access devices 12. The metal-containing caps 48 may comprise any of the conductive materials described above as being suitable for the metal-containing caps 46. In some embodiments, the metal-containing caps 48 may comprise, consist essentially of, or consist of one or more of Cu, Ru, Pt, Pd, Co, Ni, W, Mo and Ti. In some embodiments, the metal-containing caps 48 may include one or both of metal silicide (e.g., titanium silicide, tungsten silicide, molybdenum silicide, etc.) and metal nitride (e.g., titanium nitride, tungsten nitride, molybdenum nitride, etc.).

The illustrated metal-containing caps 48 have domed shapes analogous to the domed shapes of the caps 46 of FIGS. 1-1B.

In the shown embodiment, conductive interconnects 50 are over and directly against the conductive caps 48.

The conductive interconnects 50 may comprise any suitable configurations. The illustrated conductive interconnects comprise first conductive material 52 configured as upwardly-opening container shapes, and comprise second conductive material 54 configured as core material within the upwardly-opening container shapes.

The first conductive material 52 may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first conductive material 52 may comprise metal nitride (e.g., one or more of molybdenum nitride, tungsten nitride and titanium nitride).

The second conductive material 54 may comprise any suitable electrically conductive composition(s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second conductive material 54 may comprise, consist essentially of, or consist of one or more metals (e.g., one or more of molybdenum, titanium and tungsten).

In the illustrated embodiment, the storage elements 14 are electrically coupled to the conductive interconnects 50, and are electrically coupled through the conductive interconnects 50 and the conductive caps 48 to the upper source/drain regions 34 of the access devices 12.

The conductive caps 48 may advantageously improve electrical coupling between the interconnects 50 and the upper source/drain regions 34. Specifically, there may be a large barrier height along an interface between metal nitride 52 (e.g., titanium nitride) and conductive oxide 28 (e.g., indium oxide) in embodiments in which the metal nitride directly contacts the conductive oxide. The conductive caps may advantageously provide an improved conductive interface from the conductive oxide 28 to the metal nitride 52.

The domed shapes of the conductive caps 48 may provide some advantages. For instance, they may provide additional surface area as compared to analogous caps lacking the domed shape. However, it is noted that there may be applications in which the interface between the materials 48 and 52 is sufficiently conductive that the additional surface area is of little benefit.

Figure 3:
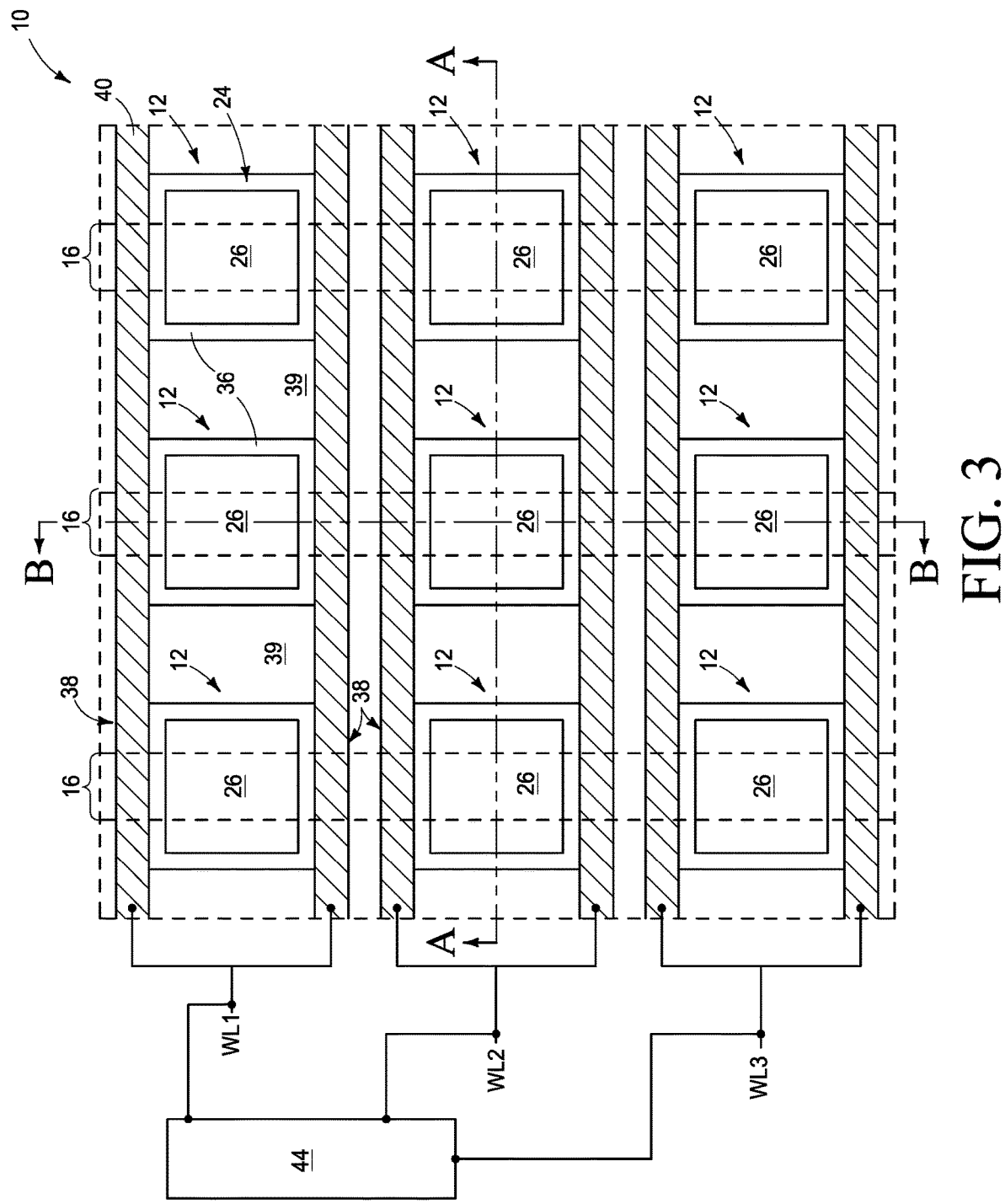
FIGS. 3-3B are diagrammatic views of a region comprising example transistors.
Figure 3A:
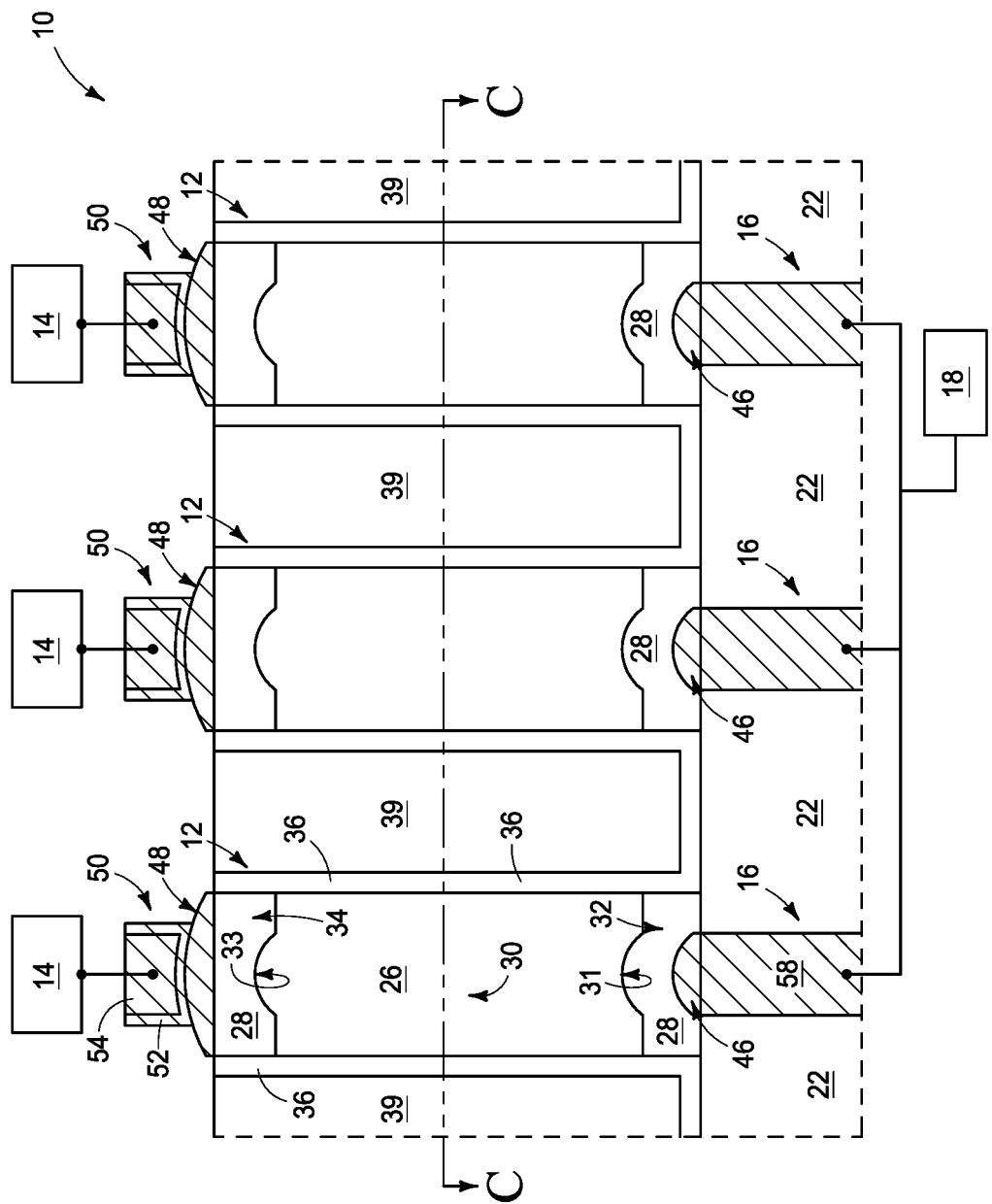
FIG. 3A is a cross-sectional side view along the line A-A of FIG. 3
Figure 3B:
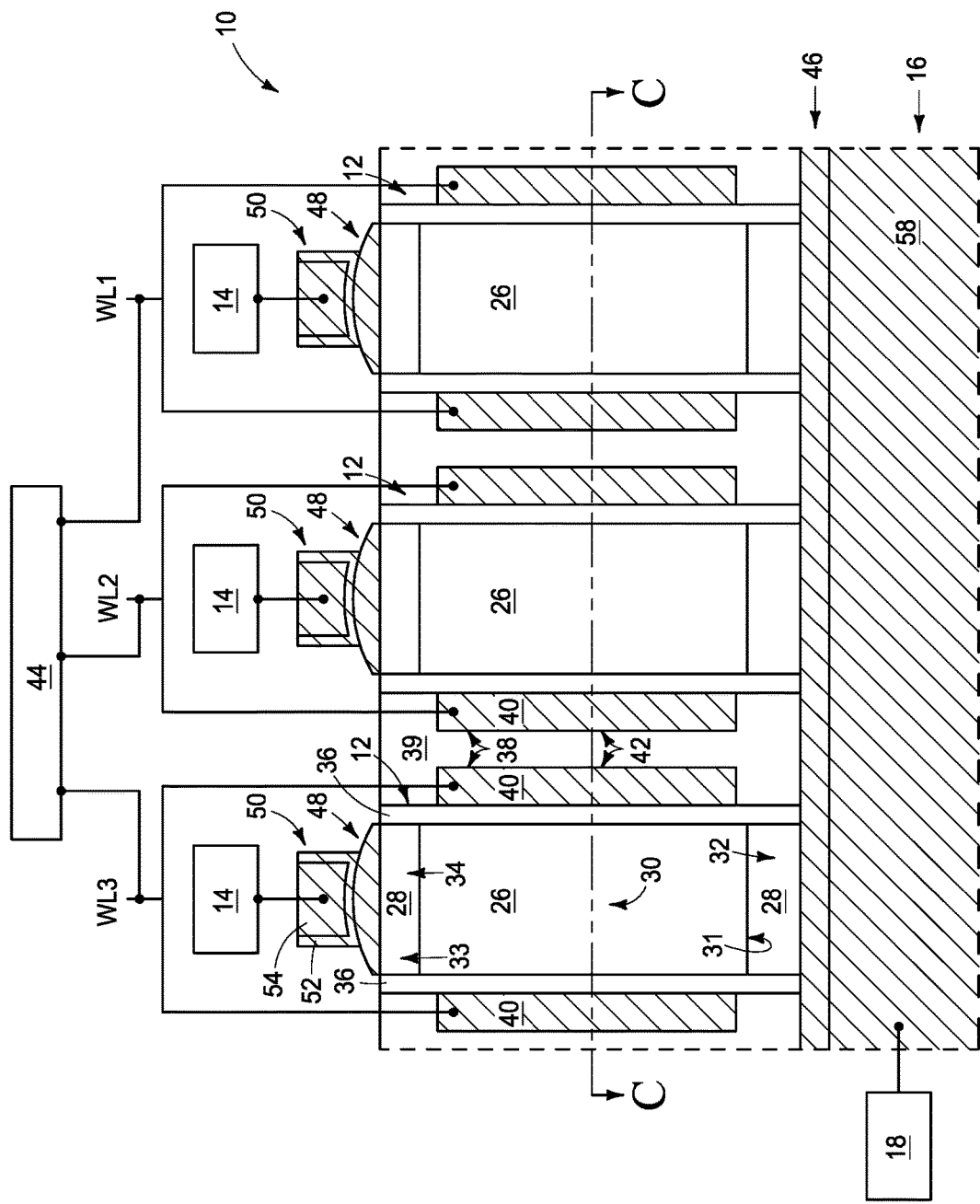

In some embodiments, the conductive caps 46 of FIGS. 1-1B may be referred to as first conductive caps, and the conductive caps 48 of FIGS. 2-2B may be referred to as second conductive caps. The first and second conductive caps may be utilized alternatively to one another as shown in FIGS. 1-1B and FIGS. 2-2B. In some embodiments, the first and second conductive caps may be utilized together with one another as shown in FIGS. 3-3B.

Figure 4:
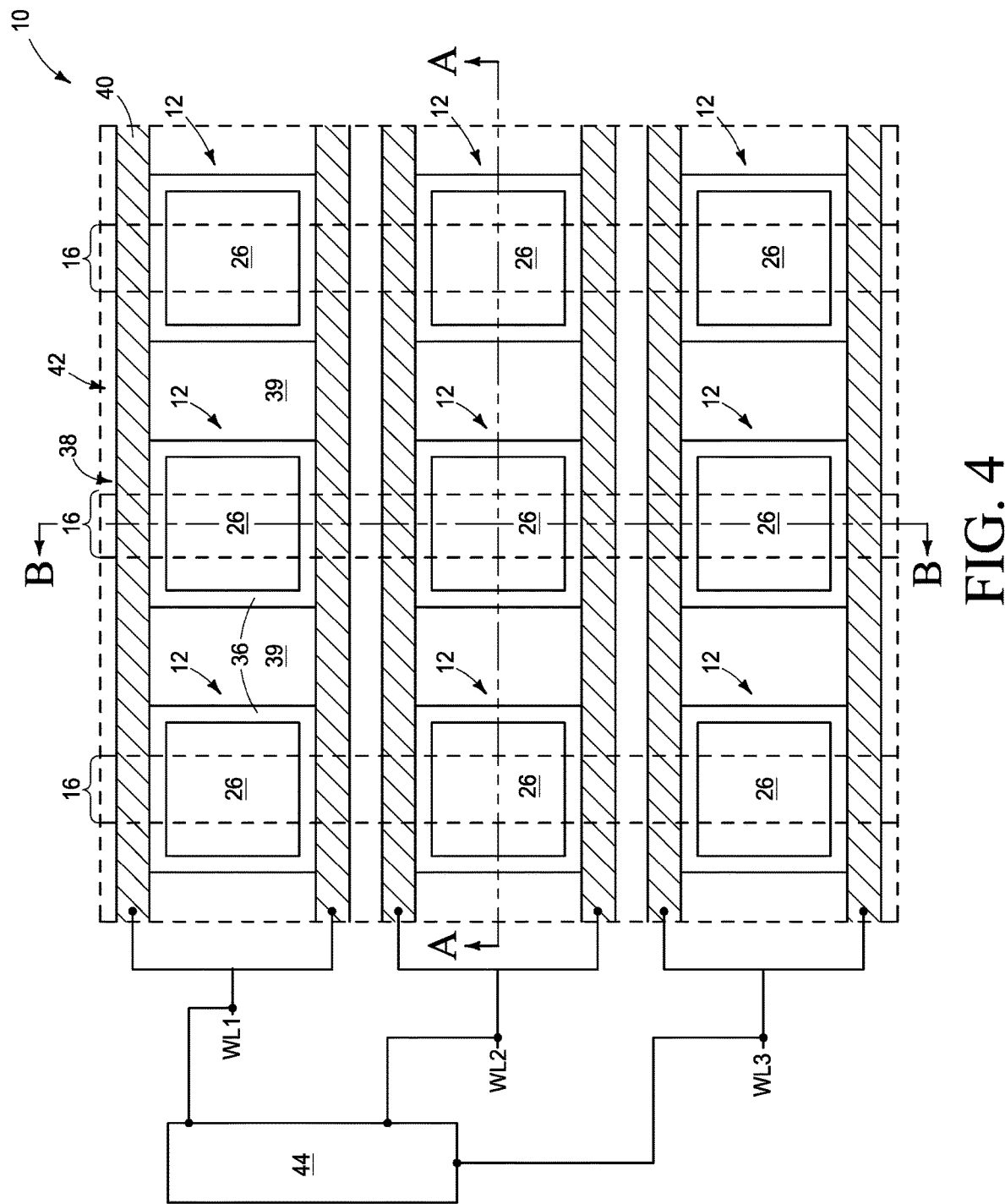
FIGS. 4-4B are diagrammatic views of a region comprising example transistors.
Figure 4A:
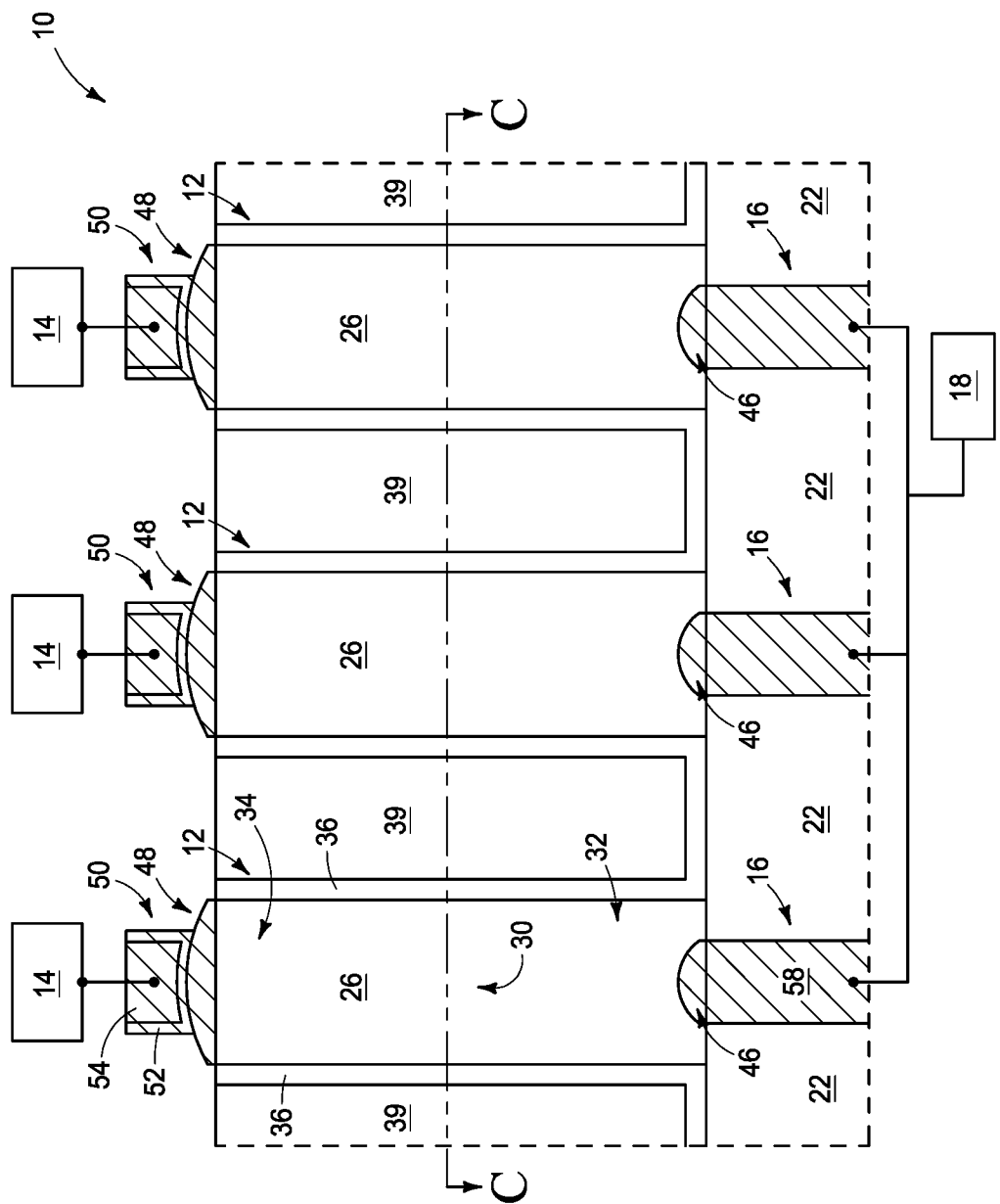
FIG. 4A is a cross-sectional side view along the line A-A of FIG. 4
Figure 4B:
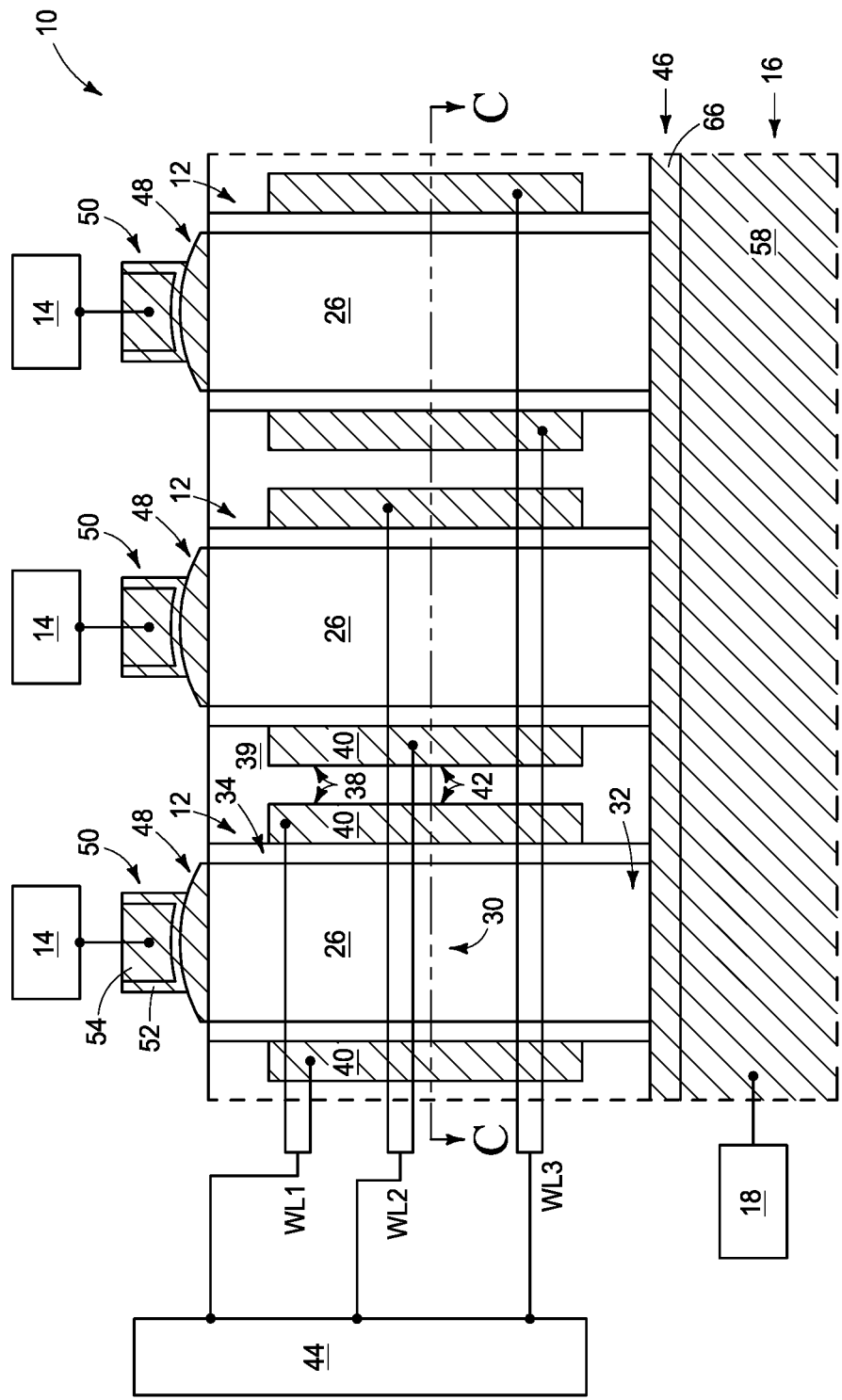

In some embodiments, the conductive oxide 28 (FIGS. 1-1B, FIGS. 2-2B and FIGS. 3-3B) may be omitted, and instead upper and lower regions of the semiconductor material 26 may be appropriately doped to be utilized as the source/drain regions 32 and 34, while a central region of the material 26 remains as the channel region 30. An example of such embodiments is shown in FIGS. 4-4B. The illustrated example has both the lower (first) domed structures 46, and the upper (second) domed structures 48. Other examples may include one or the other of the domed structures 46 and the domed structures 48 analogous to the configurations shown in FIGS. 1-1B and FIGS. 2-2B.

The assemblies described above may be formed with any suitable processing. Example processing is described with reference to FIGS. 5-9.

Figure 5:
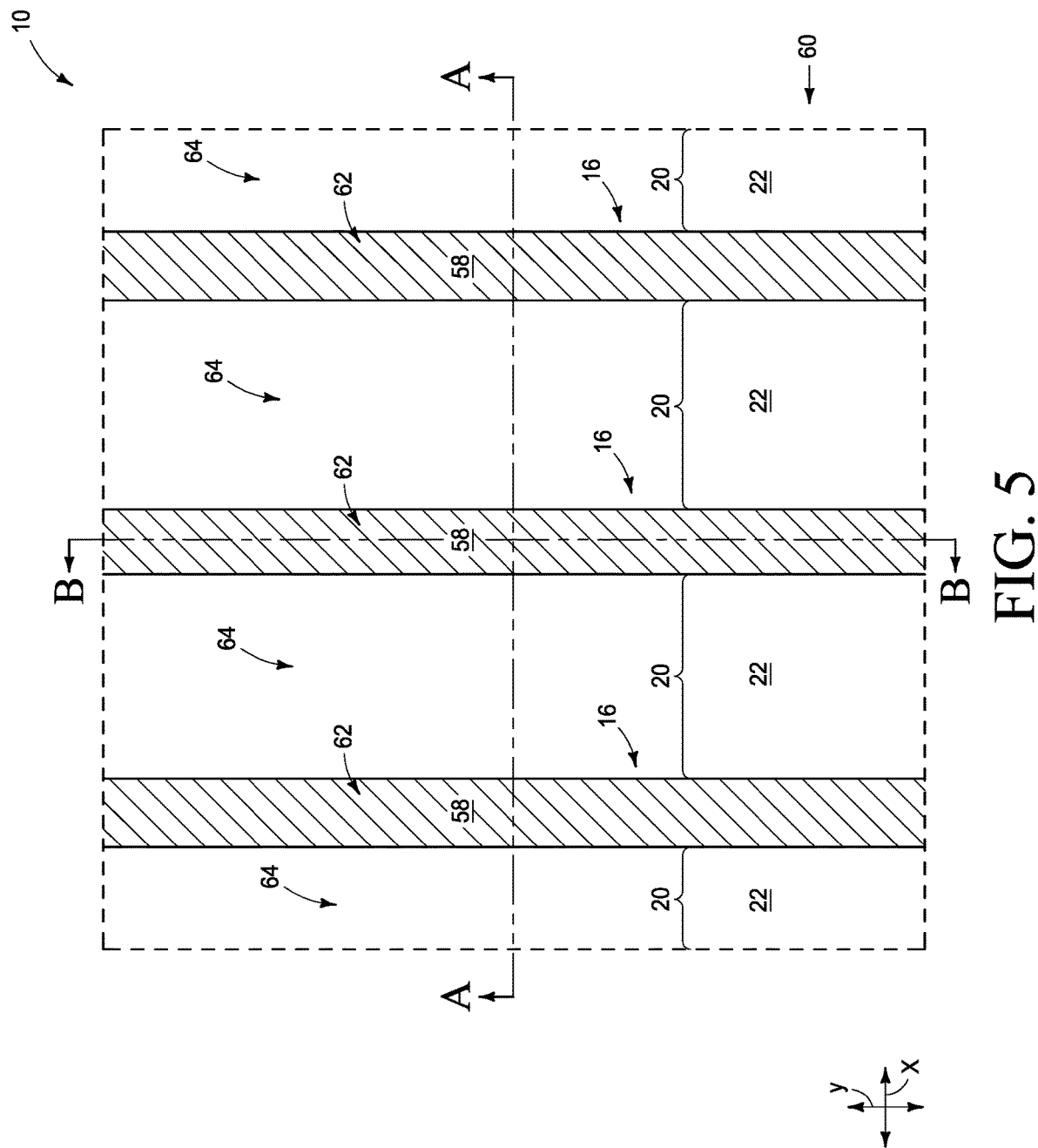
FIGS. 5-5B are diagrammatic views of a region at an example process stage of an example method.
Figure 5A:
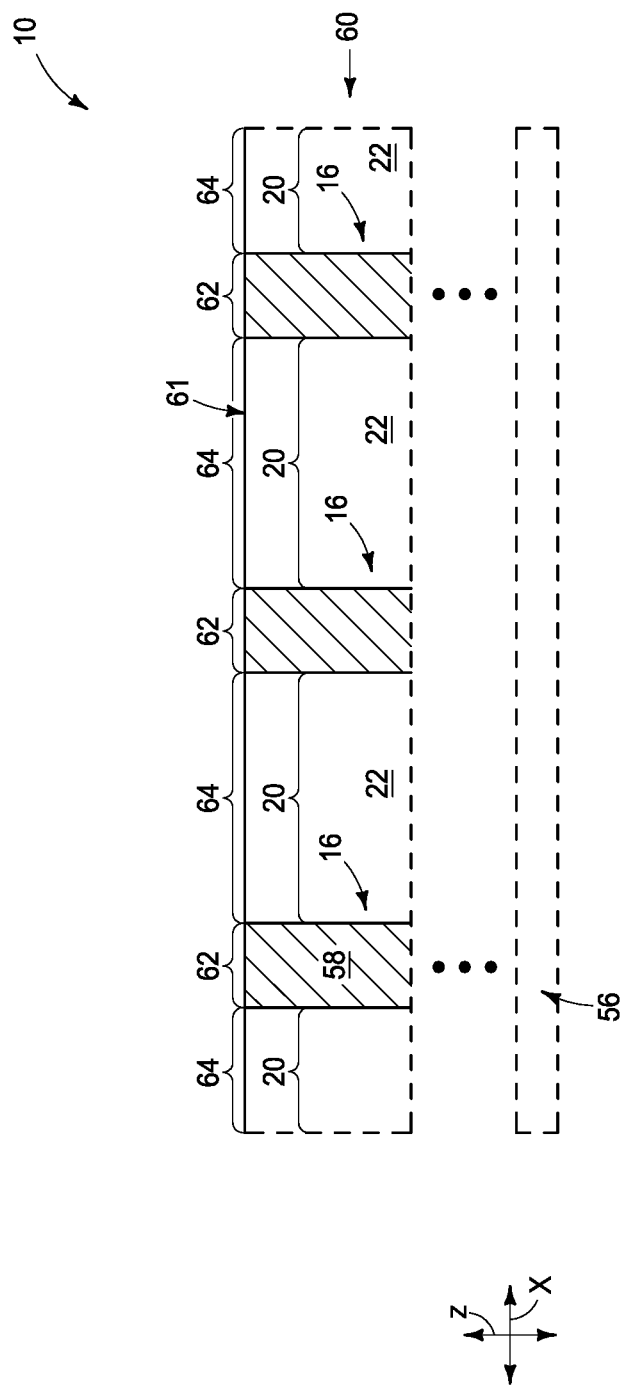
FIG. 5A is a cross-sectional side view along the line A-A of FIG. 5
Figure 5B:
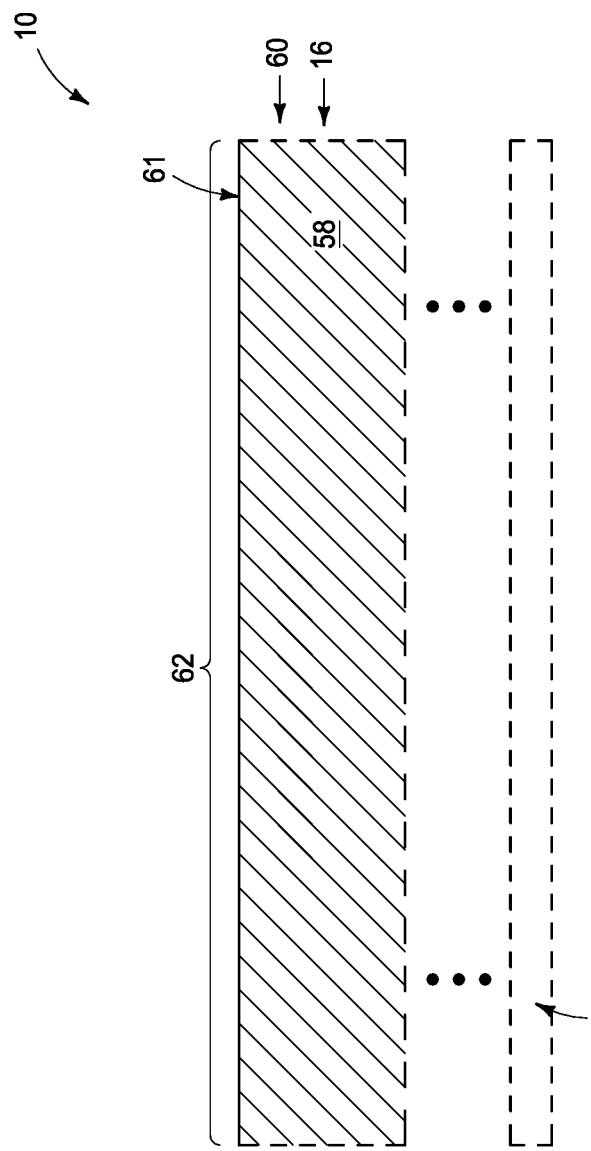

Referring to FIGS. 5-5B, the assembly 10 is shown at a process stage after the conductive structures (features) 16 and the insulative material 22 are formed over a semiconductor base 56. The base 56 may comprise semiconductor material; and may, for example, comprise, consist essentially of, or consist of monocrystalline silicon. The base 56 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 56 may correspond to a semiconductor substrate containing one or more materials associated with integrated circuit fabrication. Such materials may include, for example, one or more of refractory metal materials, barrier materials, diffusion materials, insulator materials, etc.

The conductive features 16 may be selectively coupled with the sensing circuitry 18 (shown in FIGS. 1-1B, and not shown in FIGS. 5-5B) at the process stage of FIGS. 5-5B or at any other suitable process stage.

The conductive features 16 comprise the conductive material 58. Such conductive material may comprise any of the compositions described above with reference to FIGS. 1-1B, and in some embodiments may comprise tungsten and/or molybdenum.

The conductive features 16 are linearly-extending features, and may correspond to digit lines.

The intervening regions 20 are shown to be between the conductive features 16, and are shown to comprise the insulative material 22. In some embodiments, the intervening regions 20 may be referred to as intervening insulative regions.

The insulative material 22 and conductive material 58 may be considered together to form a construction 60. The construction 60 has a planarized upper surface 61 which extends across the conductive material 58 and the insulative material 22. The planarized surface 61 may be formed with any suitable processing, including, for example, chemical-mechanical polishing (CMP). The upper surface 61 includes conductive portions (regions) 62 corresponding to upper surfaces of the conductive features 16, and includes insulative portions (regions) 64 corresponding to upper surfaces of the intervening insulative regions 22 (i.e., to upper surfaces of the insulative material 22).

Figure 6:
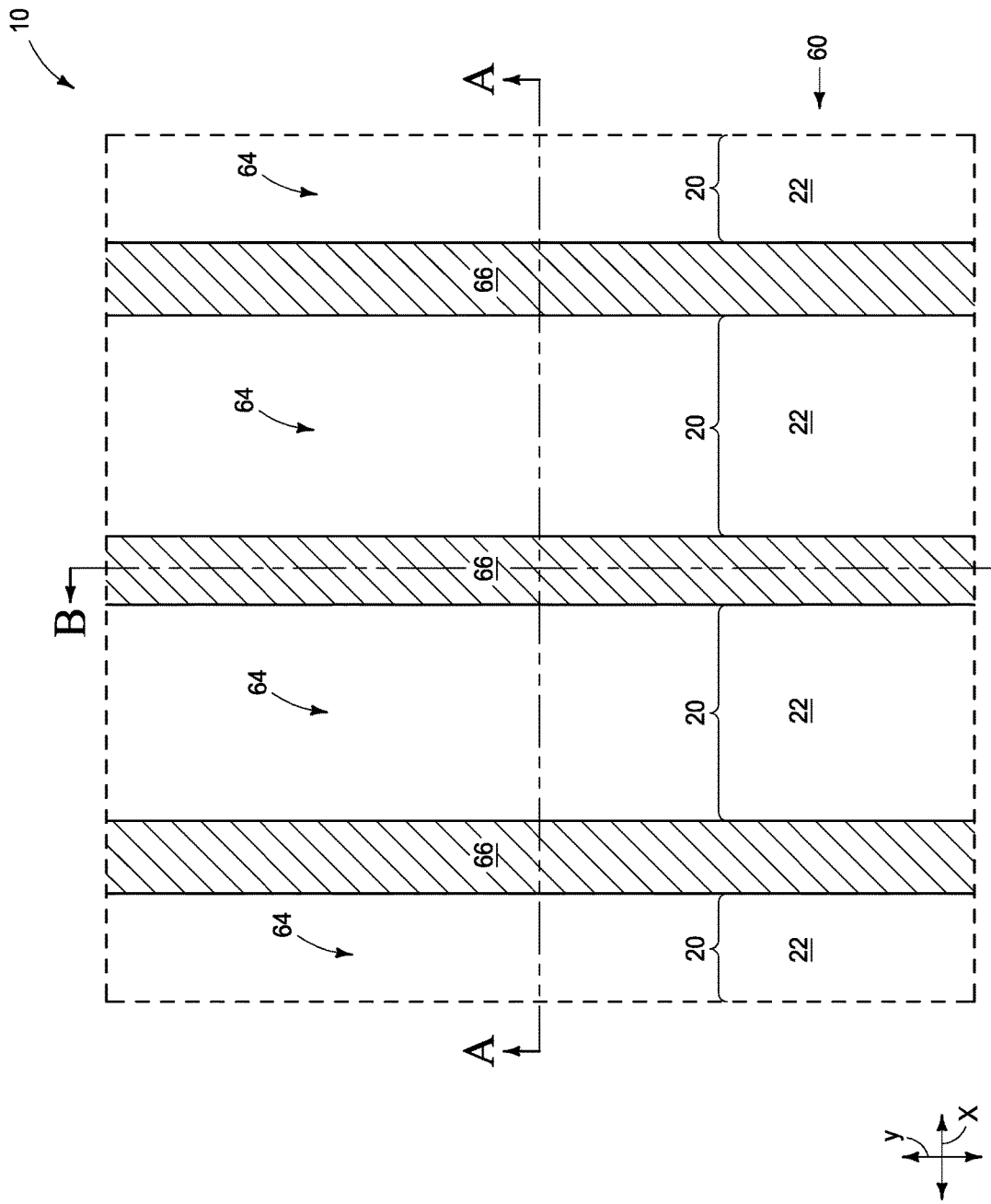
FIGS. 6-6B are diagrammatic views of the region of FIGS. 5-5B at an example process stage subsequent to that of FIGS. 5-5B.
Figure 6A:
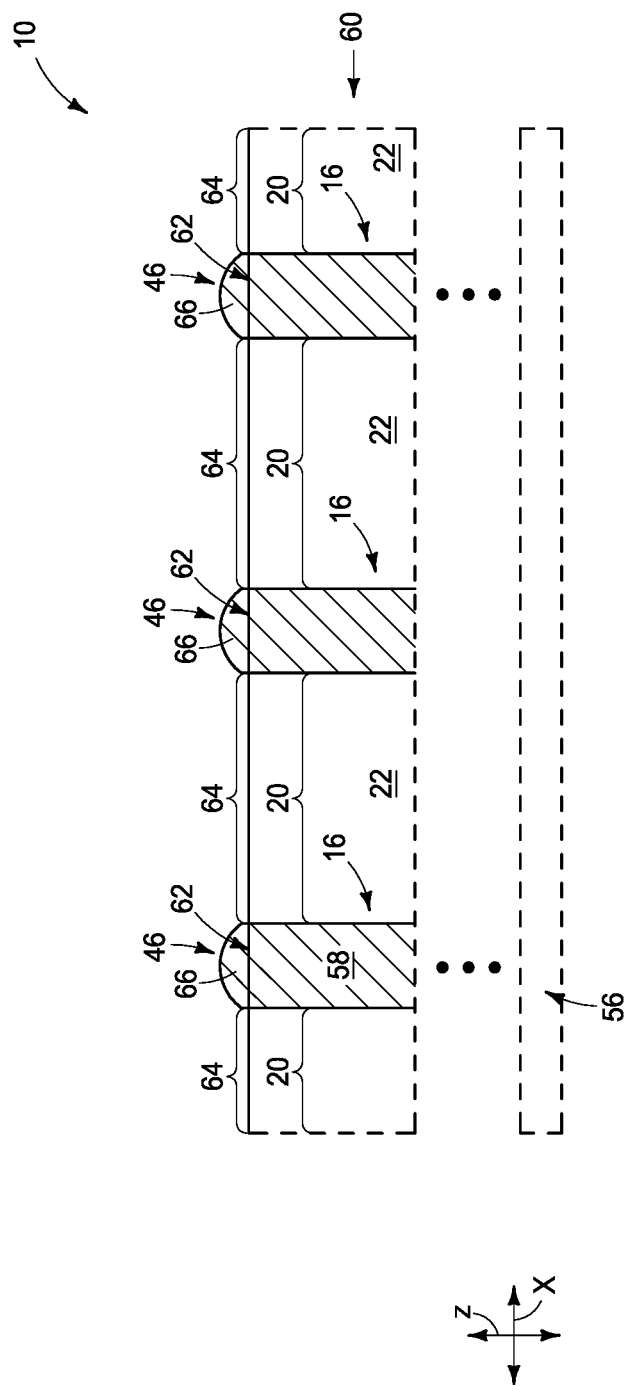
FIG. 6A is a cross-sectional side view along the line A-A of FIG. 6
Figure 6B:
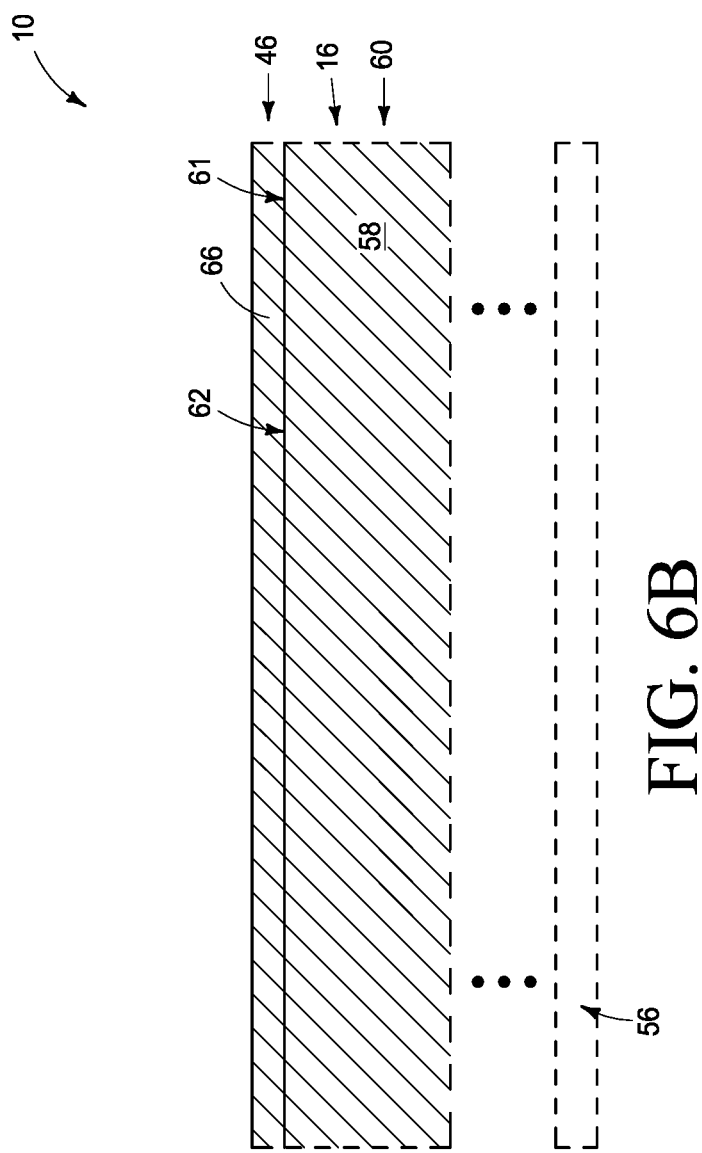

Referring to FIGS. 6-6B, conductive material 66 is selectively formed over the conductive portions 62 of the surface 61 relative to the insulative portions 64 of such surface. The conductive material 66 may be referred to as a second conductive material to distinguish it from the first conductive material 58. The conductive material 66 is configured as the conductive caps 46 described above relative to FIGS. 1-1B, and may comprise any of the compositions described above as being suitable for such conductive caps. For instance, in some embodiments the conductive material 66 may comprise, consist essentially of, or consist of one or more of Cu, Ru, Pt, Pd, Co, Ni, W, Mo and. Ti.

The material 66 may be selectively formed on the conductive regions 62 utilizing any suitable processing, including, for example, one or more of plating, atomic layer deposition (AM) and chemical vapor deposition (CVD). If plating is utilized, the plating may comprise electrolytic plating or electroless plating. The electrolytic plating may utilize a chemical solution having an ionic form of a metal desired to be within the material 66 of the conductive caps 46, and may utilize current applied through the conductive structures 16 to induce deposition of the metal from the chemical solution onto the conductive structures 16 to form the conductive caps 46 over such conductive structures. The electroless plating may utilize an auto-catalytic plating solution to achieve the selective plating on the conductive material 58.

The conductive caps 46 may be formed as the illustrated domed structures due to the conductive material 66 depositing more rapidly along the central regions of the conductive structures 16 than along the edge regions. In the case of the electrolytic plating, such doming may occur due to the central regions of the conductive structures 16 having higher current flow than the edge regions. In the case of electroless plating, CVD and ALD; such doming may occur due to the deposition of the material 66 initiating at the central regions of the features and thus occurring for a longer duration along the central regions of the features than along the edge regions of the features.

Figure 7:
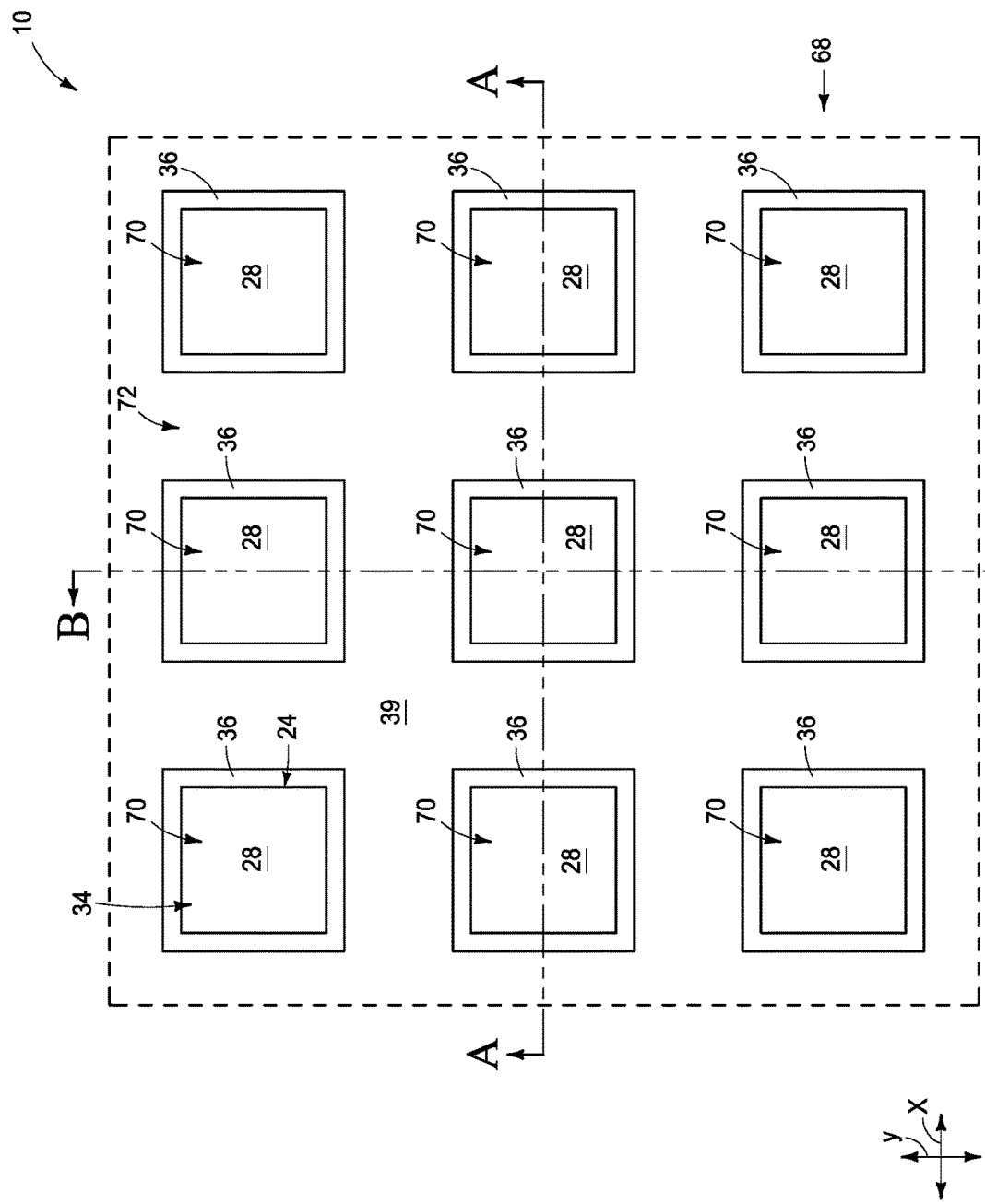
FIGS. 7-7B are diagrammatic views of the region of FIGS. 5-5B at an example process stage subsequent to that of FIGS. 6-6B.
Figure 7A:
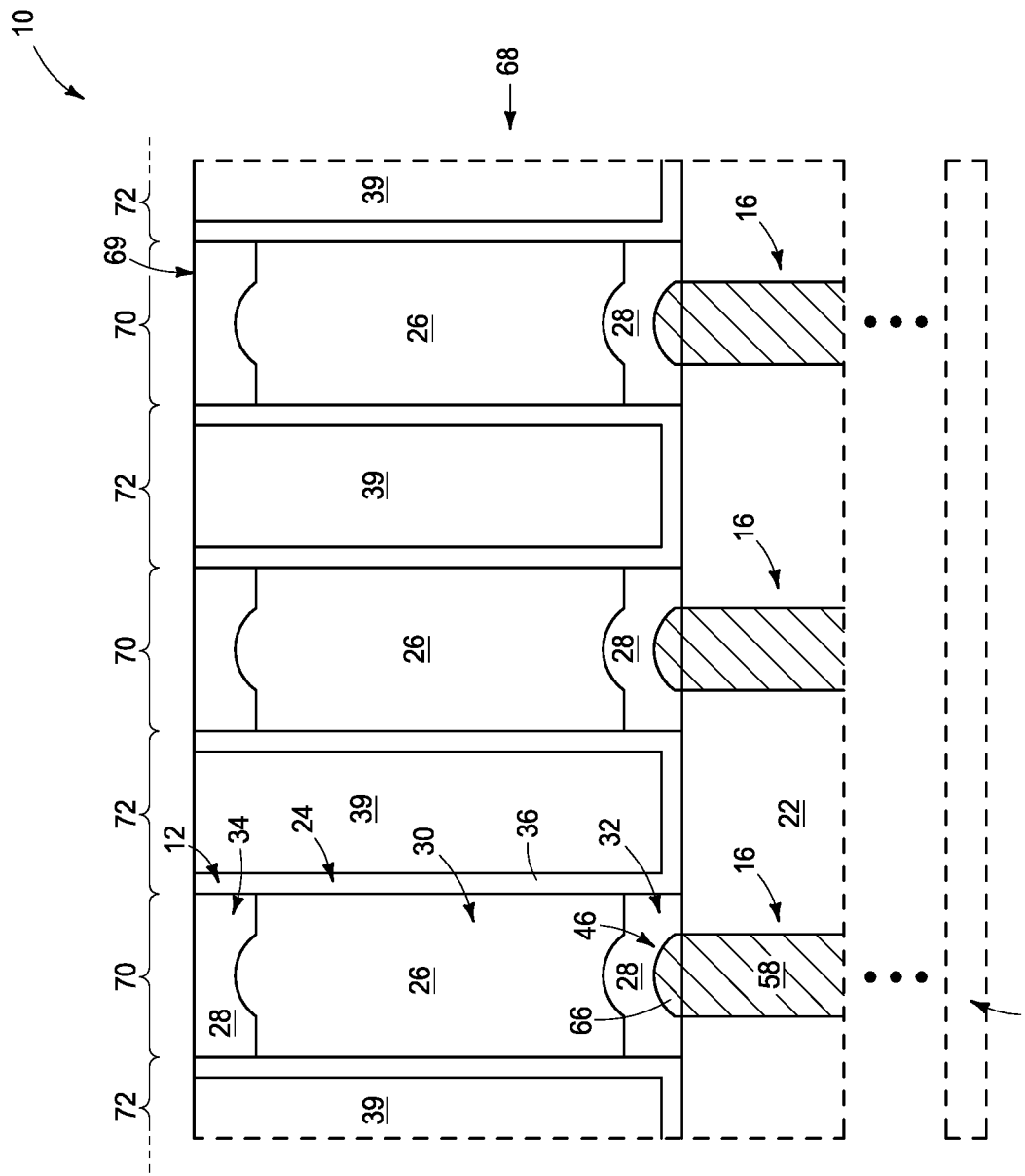
FIG. 7A is a cross-sectional side view along the line A-A of FIG. 7
Figure 7B:
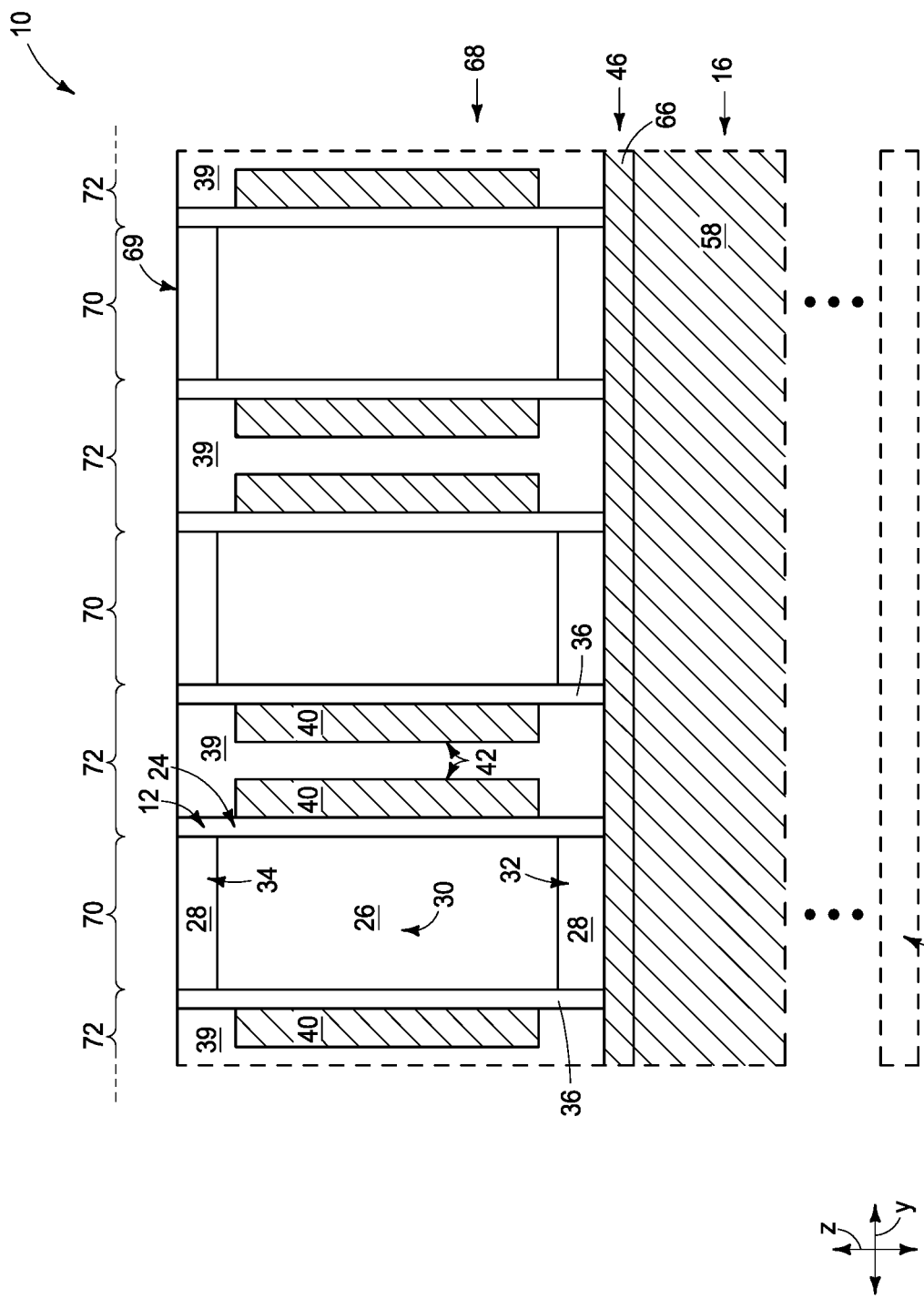

Referring to FIGS. 7-7B, the access device pillars 24 are formed over the second conductive material 66 of the conductive caps 46. The access device pillars 24 comprise the semiconductor material 26 and the conductive oxide 28 described above with reference to FIGS. 1-1B. In other embodiments, the access device pillars 24 may only comprise the semiconductor material 26 analogous to the embodiment described above with reference to FIGS. 4-4B.

The insulative material 36 is formed along sidewalls of the pillars 24, and the conductive gate material 40 is formed adjacent the insulative material 36. The insulative material 39 is then formed over the conductive gate material 40. In some embodiments, the insulative materials 36 and 39 may be referred to as first and second insulative materials, respectively.

The conductive gate material 40 is configured as linearly-extending structures 42. In some embodiments, such structures may be wordlines, and may be electrically coupled with driver circuitry 44 (shown in FIGS. 1-1B, and not shown in FIGS. 7-7B). The coupling of the wordlines 42 with the driver circuitry 44 may be provided at any suitable process stage, including, for example, the process stage of FIGS. 7-7B or a process stage subsequent to that of FIGS. 7-7B.

The configuration of FIGS. 7-7B may be considered to be a construction 68 which includes the access device pillars 24 and the insulative material 39. The construction 68 has a planarized upper surface 69 which extends across the conductive oxide 28 of the upper source/drain regions 34 (i.e., which extends across upper surfaces of the access device pillars 24), and which extends across the insulative material 39. In the illustrated embodiment, the planarized surface 69 also extends across portions of the insulative material 36.

The planarized surface 69 may be formed with any suitable processing, including, for example, CMP. The upper surface 69 includes conductive portions (regions) 70 corresponding to upper surfaces of the access device pillars 24, and includes insulative portions (regions) 72 between the conductive regions 70.

Figure 8A:
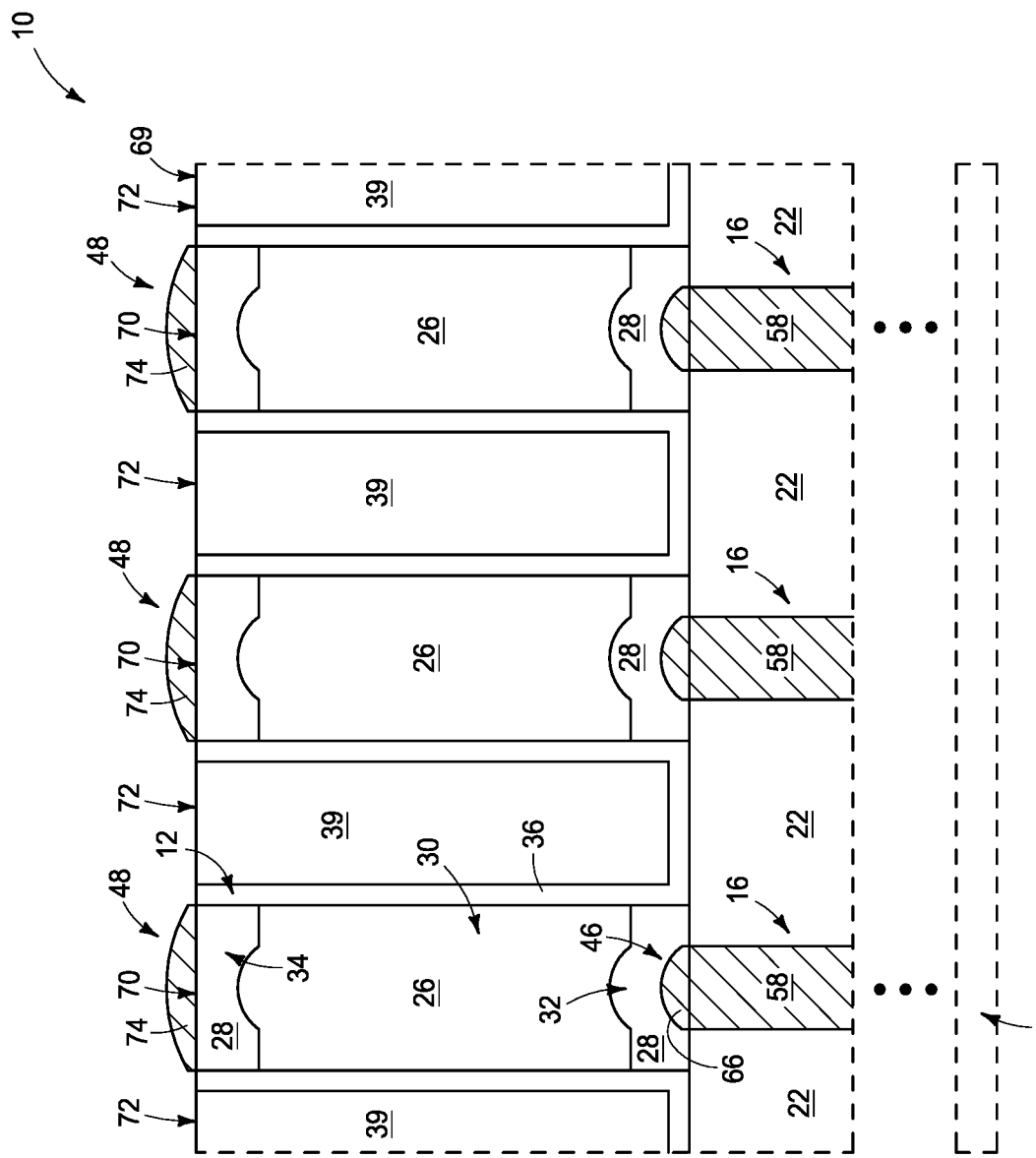
FIG. 8A is a cross-sectional side view along the line A-A of FIG. 8
Figure 8A:
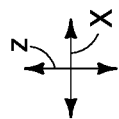
Figure 8B:
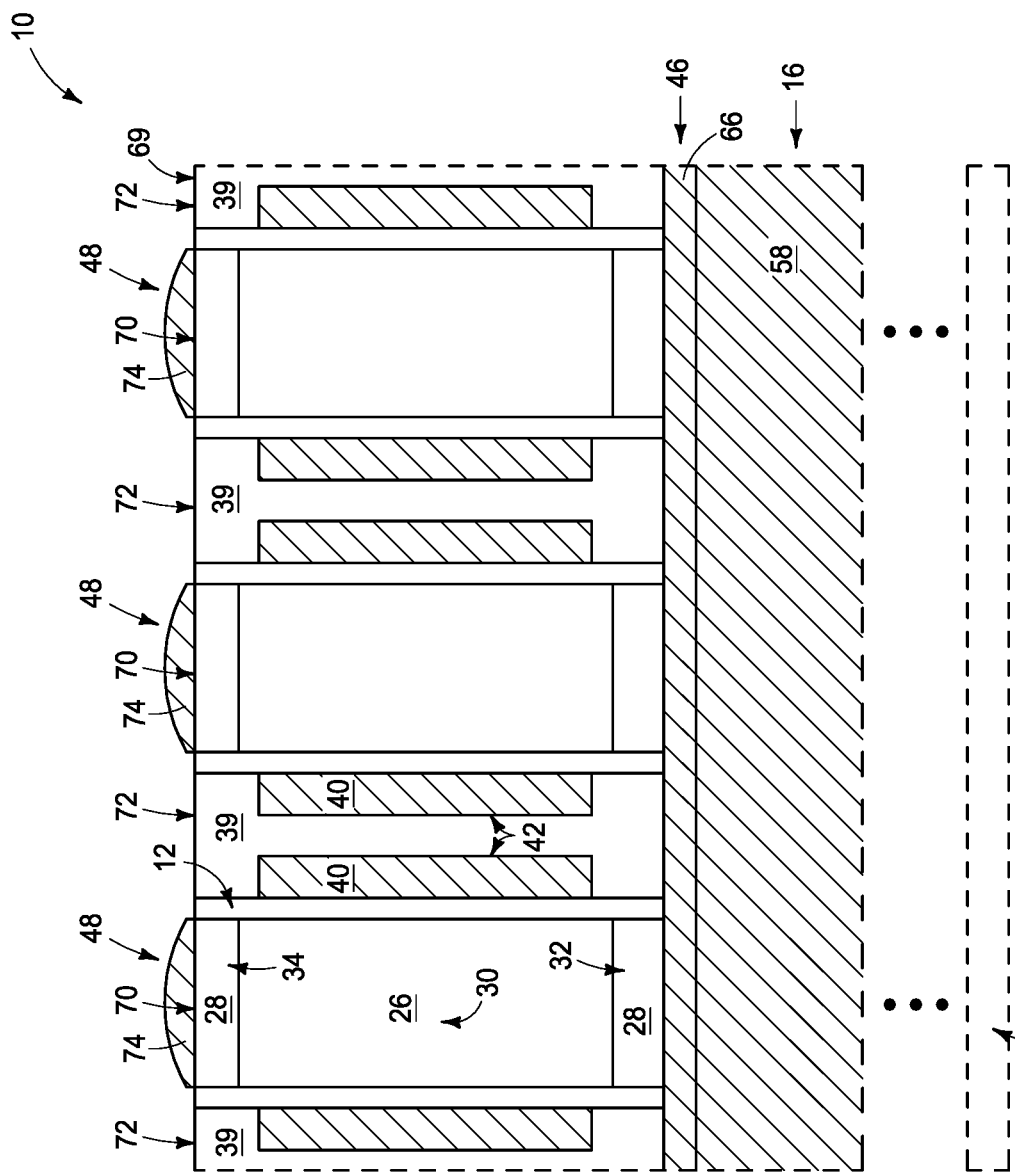

Referring to FIGS. 8-8B, conductive material 74 is selectively formed over the conductive portions 70 of the surface 69 relative to the insulative portions 72 of such surface. The conductive material 74 may be referred to as a third conductive material to distinguish it from the first and second conductive materials 58 and 66. The conductive material 74 is configured as the conductive caps 48 described above relative to FIGS. 2-2B, and may comprise any of the compositions described above as being suitable for such conductive caps. For instance, in some embodiments the conductive material 74 may comprise, consist essentially of, or consist of one or more of Cu, Ru, Pt, Pd, Co, Ni, W, Mo and Ti.

The material 74 may be selectively formed on the conductive regions 70 utilizing any suitable processing, including, for example, one or more of plating, ALD and CVD; with such processing being analogous to that described above with reference to FIGS. 6-6B.

Figure 9:
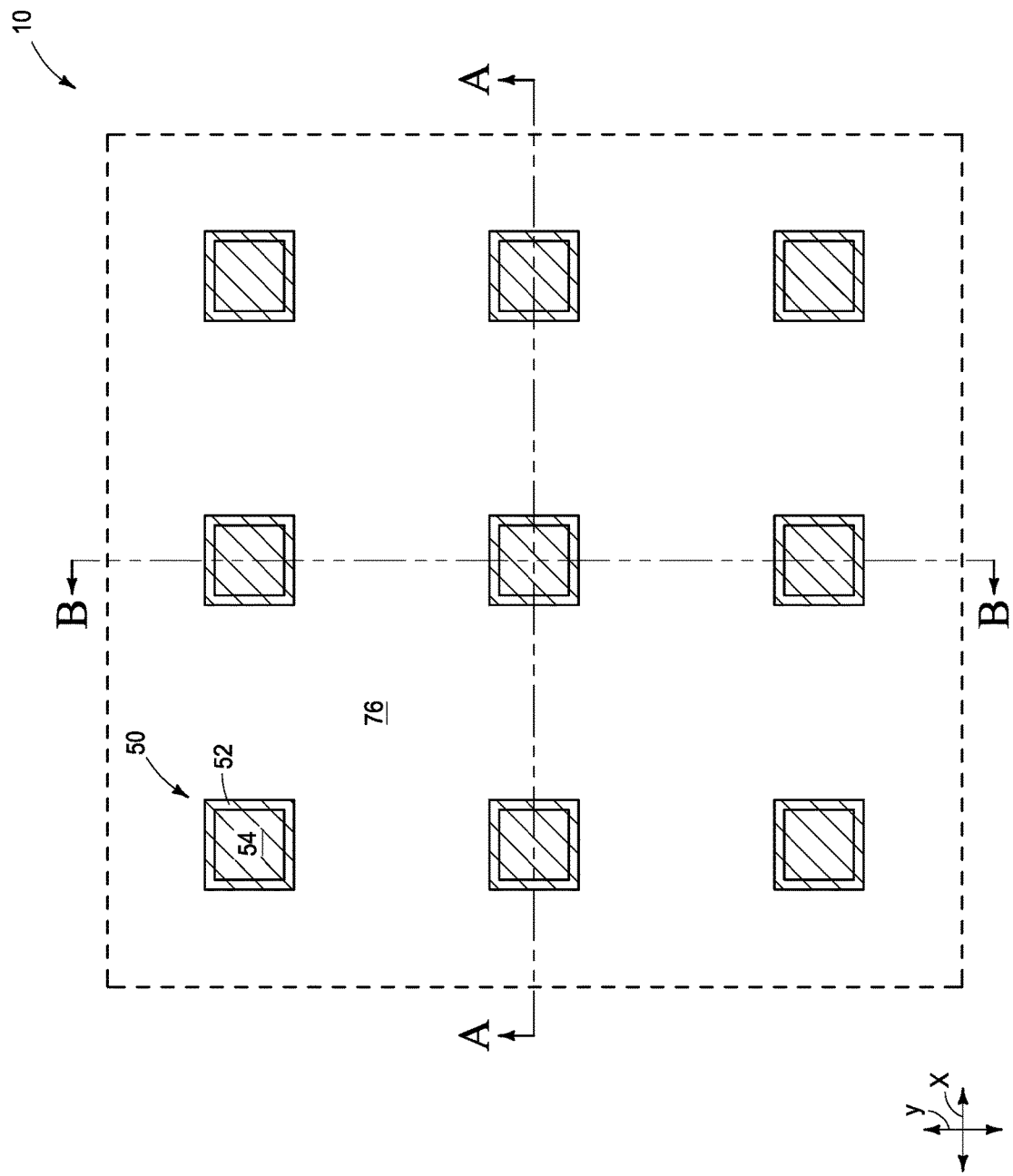
FIGS. 9-9B are diagrammatic views of the region of FIGS. 5-5B at an example process stage subsequent to that of FIGS. 8-8B.
Figure 9A:
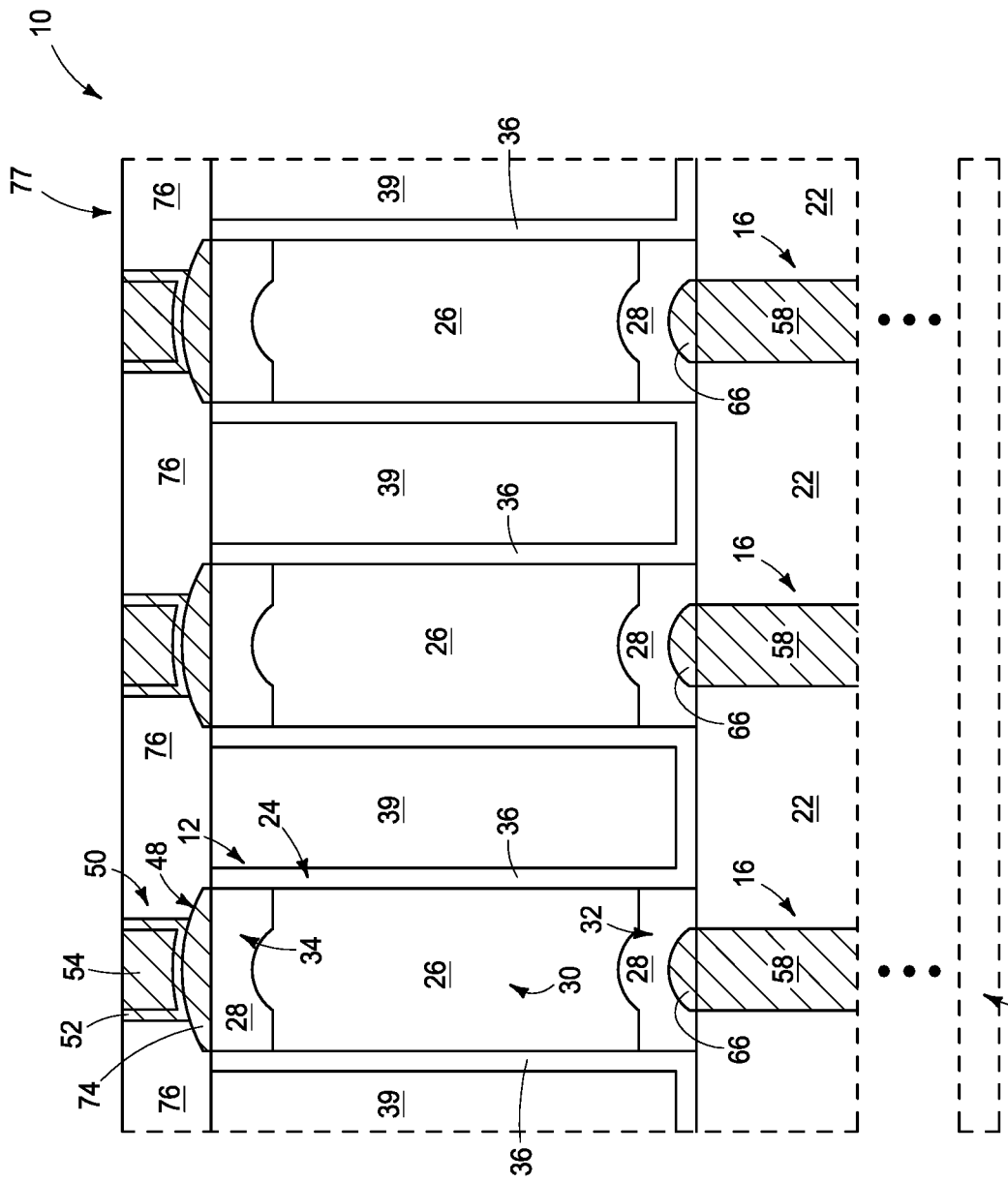
FIG. 9A is a cross-sectional side view along the line A-A of FIG. 9
Figure 9B:
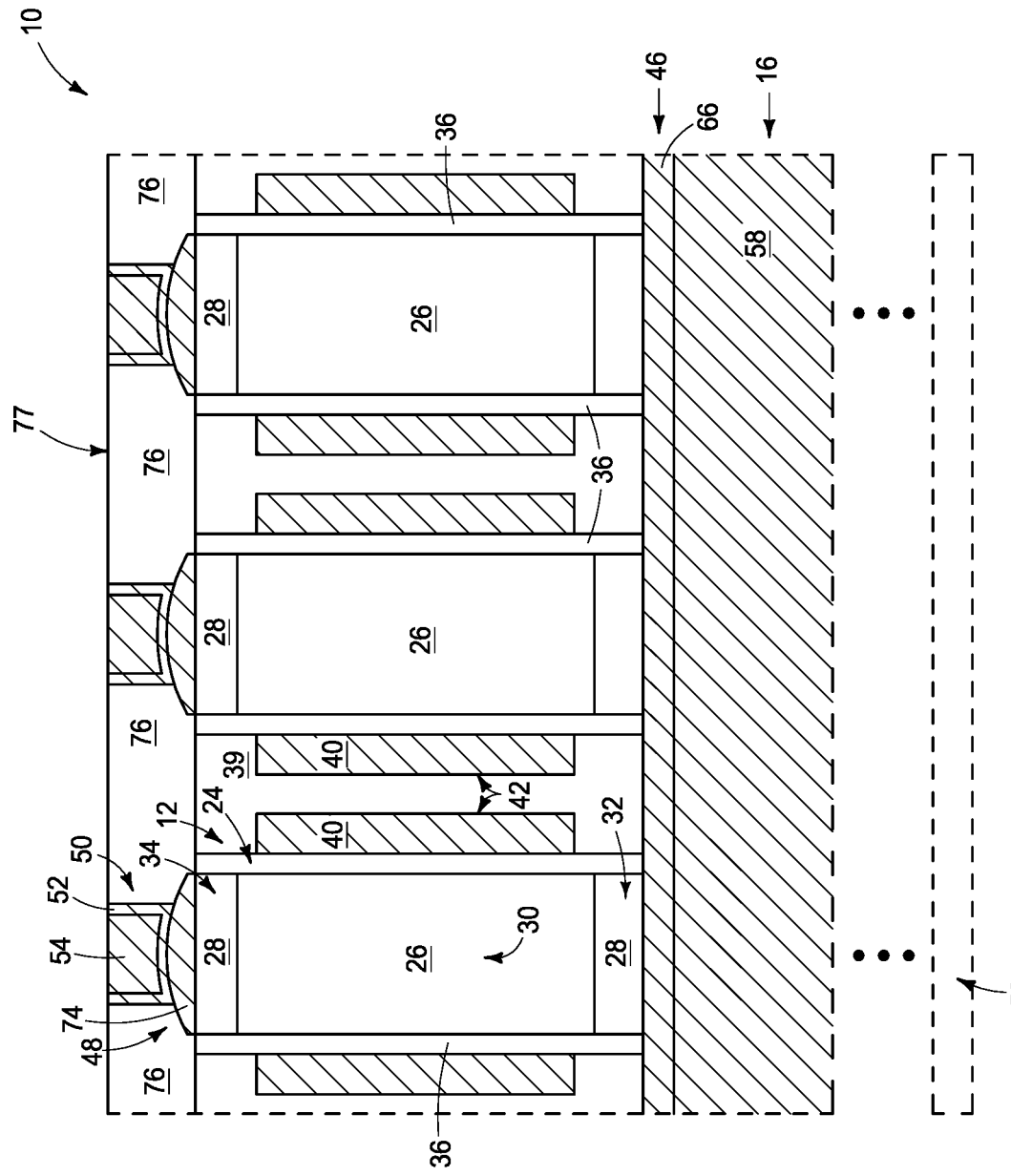

Referring to FIGS. 9-9B, the conductive interconnects 50 are formed over the conductive caps 48. In the illustrated embodiment, insulative material 76 is provided across the caps 48. Openings may be formed through such insulative material to expose upper surface of the caps, and then the interconnects 50 may be formed within such openings. The metal nitride 52 may be formed to line the openings, and then the core material 54 may be formed within the lined openings. Subsequently, CMP or other suitable processing may be utilized to form the illustrated planarized surface 77 extending across the interconnects 50 and the insulative material 76. In subsequent processing, the storage elements 14 (FIGS. 2-2B) may be electrically coupled with the interconnects 54.

The processing of FIGS. 5-9 forms both the bottom conductive caps 46 and the top conductive caps 48. In other embodiments, processing may be utilized to form assemblies having only the bottom conductive caps 46 (analogous to the assembly of FIGS. 14B) or assemblies having only the upper conductive caps 48 (analogous to the assembly of FIGS. 2-2B).

The access device pillars 24 may be arranged in a memory array analogous to the array described above with reference to FIGS. 1-1B, with each of the access device pillars being uniquely addressed by one of the first linearly-extending structures 16 and one of the second linearly-extending structures 42.

Figure 10:
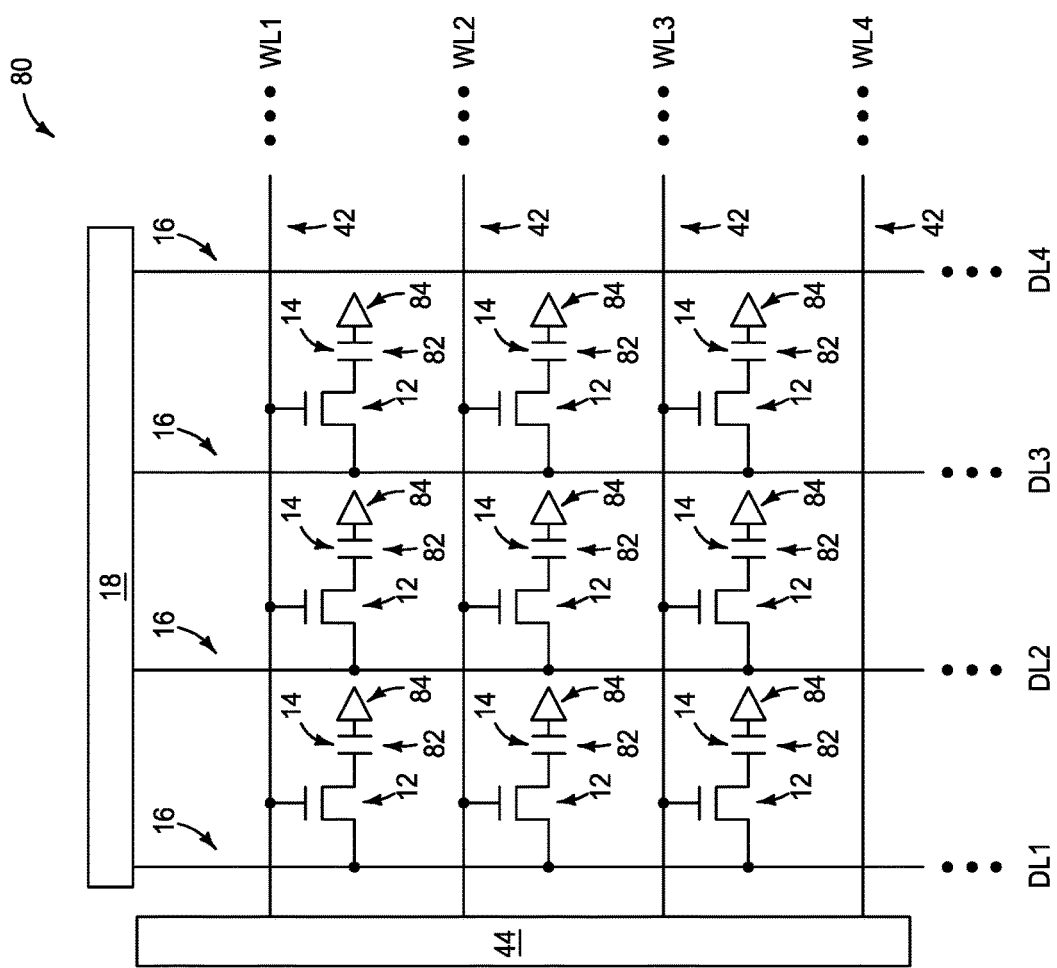
FIG. 10 is a diagrammatic schematic view of a region of an example memory array.

The memory arrays comprising the access device pillars 24 and the storage elements 14 may comprise any suitable configurations. FIG. 10 shows an example configuration for a DRAM array 80. Such configuration has digit lines 16 (DL1-DL4) coupled with the sensing circuitry 18 and extending along columns of the array, and has wordlines 42 (WL1-WL4) coupled with the driver circuitry 44 and extending along rows of the array. Memory cells 82 comprise the access transistors 12 and the storage elements 14, with the illustrated storage elements being configured as capacitors. Each of the capacitors has a first electrical node coupled with an associated access device 12, and a second electrical node coupled with a reference voltage source 84 (e.g., a common plate voltage, such as, for example, ground, VCC/2, etc.). Each of the memory cells 82 is uniquely addressed by one of the digit lines in combination with one of the wordlines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, muitichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one terra in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a device having semiconductor material which comprises at least one element selected from Group 13 of the periodic table in combination with at least one element selected from Group 16 of the periodic table. The device has a conductive structure beneath the semiconductor material and configured to be electrically coupled with the semiconductor material in at least one operational mode of the device. The device has a domed metal-containing cap over the conductive structure and under the semiconductor material.

Some embodiments include an integrated assembly having an access device between a storage dement and a conductive structure. The access device has channel material which includes semiconductor material. The semiconductor material comprises at least one element selected from Group 13 of the periodic table in combination with at least one element selected from Group 16 of the periodic table. The channel material has a first end and an opposing second end, and has a side extending from the first end to the second end. The first end is adjacent the conductive structure, and the second end is adjacent the storage element. Conductive gate material is adjacent the side of the channel material. A first domed metal-containing cap is over the conductive structure and under the channel material and/or a second domed metal-containing cap is over the channel material and under the storage dement.

Some embodiments include a method of forming an integrated assembly. Conductive features are formed over a semiconductor base. The conductive features comprise first conductive material. The conductive features are spaced from one another by intervening insulative regions. A construction comprises the conductive features and the insulative regions. An upper surface of the construction includes conductive portions corresponding to upper surfaces of the conductive features, and includes insulative portions corresponding to upper surfaces of the intervening insulative regions. Second conductive material is selectively formed over the conductive portions relative to the insulative portions. Access device pillars are formed over the second conductive material. The access device pillars include channel material which comprises semiconductor material having at least one element selected from Group 13 of the periodic table in combination with at least one element selected from Group 16 of the periodic table. Insulative material is formed along one or more sidewalk of each of the access device pillars. Conductive gates are formed adjacent the insulative material. Storage elements are formed over the access device pillars and are gatedly coupled to the conductive features through the channel material of the access device pillars.

Some embodiments include a method of forming an integrated assembly. First linearly-extending conductive structures are formed over a semiconductor base. The first linearly-extending conductive structures extend along a first direction. Access device pillars are formed over the first linearly-extending conductive structures. The access device pillars include channel material which comprises semiconductor material having at least one element selected from Group 13 of the periodic table in combination with at least one element selected from Group 16 of the periodic table. First insulative material is formed along one or more sidewalls of the access device pillars. Conductive gates are formed adjacent the first insulative material. The conductive gates are along second linearly-extending features which extend along a second direction, with the second direction crossing the first direction. Second insulative material is formed over the conductive gates and between the access device pillars. A construction comprises the access device pillars and the second insulative material. The construction has an upper surface with conductive regions corresponding to upper surfaces of the access device pillars, and with insulative regions between the conductive regions and comprising the second insulative material. Conductive capping material is selectively formed over the conductive regions relative to the insulative regions. Storage elements are formed to be coupled with the conductive capping material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising an access device between a storage element and a conductive structure; the access device comprising:
    channel material comprising semiconductor material; the channel material having a first end and an opposing second end, and having a side extending from the first end to the second end; the first end being adjacent the conductive structure, and the second end being adjacent the storage element; the semiconductor material comprising at least one element selected from Group 13 of the periodic table in combination with at least one element selected from Group 16 of the periodic table;
    conductive gate material adjacent the side of the channel material; and
    at least one of a first domed metal-containing cap over the conductive structure and under the channel material and a second domed metal-containing cap over the channel material and under the storage element.

2. The integrated assembly of claim 1 wherein the semiconductor material is a semiconductor oxide.

3. The integrated assembly of claim 1 wherein the conductive structure is a first linear structure and is coupled with sensing circuitry, and wherein the conductive gate material is part of a second linear structure which is coupled with driver circuitry.

4. The integrated assembly of claim 1 comprising the first domed metal-containing cap.

5. The integrated assembly of claim 1 comprising the second domed metal-containing cap.

6. The integrated assembly of claim 1 comprising both the first domed metal-containing cap and the second domed metal-containing cap.

7. The integrated assembly of claim 1 wherein the storage element and the access device are within a memory cell, and wherein the memory cell is one of many substantially identical memory cells of a memory array.

8. The integrated assembly of claim 1 comprising insulative material between the conductive gate material and the channel material.

9. The integrated assembly of claim 8 wherein the insulative material comprises silicon dioxide and/or one or more high-k compositions.

10. The integrated assembly of claim 1 comprising:
a first conductive region between the conductive structure and the channel material; and
a second conductive region over the channel material, wherein the first and second conductive regions comprise conductive oxide.

11. The integrated assembly of claim 10 comprising:
the second domed metal-containing cap over and directly against the conductive oxide of the second conductive region; and
a conductive interconnect over the second domed metal-containing cap, the conductive interconnect being electrically coupled with the storage element.

12. The integrated assembly of claim 11 wherein the conductive interconnect comprises metal nitride directly against the second domed metal-containing cap.

13. The integrated assembly of claim 12 wherein the metal nitride is configured as an upwardly-opening container shape, and comprising a metal-containing core material within the upwardly-opening container shape; the core material consisting essentially of one or more metals.

14. The integrated assembly of claim 13 wherein the metal nitride comprises one or more of titanium nitride, molybdenum nitride and tungsten nitride, and wherein the core material comprises one or more of titanium, molybdenum and tungsten.

15. A device comprising:
semiconductor material comprising a transistor channel and at least one element selected from Group 13 of the periodic table in combination with at least one element selected from Group 16 of the periodic table, the transistor channel comprising a domed uppermost surface;
a conductive structure beneath the semiconductor material and configured to be electrically coupled with the semiconductor material in at least one operational mode of the device;
a domed metal-containing cap over the conductive structure and under the semiconductor material;
a source/drain region against the domed uppermost surface of the transistor channel; and
wherein the source/drain region comprises an indented lowermost surface against the domed uppermost surface of the transistor channel.

* * * * *